(12) United States Patent
Mitani et al.

(10) Patent No.: US 9,040,949 B2
(45) Date of Patent: May 26, 2015

(54) INFORMATION RECORDING DEVICE AND METHOD OF MANUFACTURING THE SAME

(75) Inventors: Yuichiro Mitani, Miura-gun (JP); Daisuke Matsushita, Fujisawa (JP); Shosuke Fujii, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 442 days.

(21) Appl. No.: 13/051,636

(22) Filed: Mar. 18, 2011

(65) Prior Publication Data

US 2011/0240949 A1  Oct. 6, 2011

(30) Foreign Application Priority Data

Mar. 31, 2010 (JP) ................................ 2010-082875

(51) Int. Cl.
*H01L 45/00* (2006.01)
*G11C 11/56* (2006.01)
*H01L 27/24* (2006.01)

(52) U.S. Cl.
CPC ............ *H01L 45/1641* (2013.01); *G11C 11/56* (2013.01); *G11C 11/5614* (2013.01); *G11C 11/5664* (2013.01); *G11C 11/5685* (2013.01); *G11C 2213/33* (2013.01); *H01L 27/2436* (2013.01); *H01L 27/2463* (2013.01); *H01L 45/085* (2013.01); *H01L 45/1233* (2013.01)

(58) Field of Classification Search
CPC .............. G11C 11/56; G11C 11/5614; G11C 11/5685; H01L 27/2463; H01L 45/085; H01L 45/1233; H01L 45/1641
USPC ........................ 257/1, 2, 3, 4, 5; 365/148, 163
See application file for complete search history.

(56) References Cited

U.S. PATENT DOCUMENTS

| 7,297,975 | B2 * | 11/2007 | Ufert .................................. 257/2 |
| 2007/0045604 | A1 * | 3/2007 | Liu et al. ............................ 257/2 |
| 2007/0274120 | A1 | 11/2007 | Pinnow et al. |
| 2009/0085025 | A1 * | 4/2009 | Arai et al. .......................... 257/4 |
| 2010/0108978 | A1 * | 5/2010 | Venkatasamy et al. ............ 257/4 |
| 2012/0280196 | A1 * | 11/2012 | Yang et al. ......................... 257/1 |

FOREIGN PATENT DOCUMENTS

JP   2008-244090   10/2008

OTHER PUBLICATIONS

Sung Hyun Jo, et al., "CMOS Compatible Nanoscale Nonvolatile Resistance Switching Memory", Nano Letters, vol. 8, No. 2, 2008, pp. 392-397.

* cited by examiner

*Primary Examiner* — Matthew W Such
*Assistant Examiner* — David Spalla
(74) *Attorney, Agent, or Firm* — Oblon, McClelland, Maier & Neustadt, L.L.P.

(57) ABSTRACT

According to one embodiment, an information recording device includes first and second electrodes, a variable resistance layer between the first and second electrodes, and a control circuit which controls the variable resistance layer to n (n is a natural number except 1) kinds of resistance. The variable resistance layer comprises a material filled between the first and second electrodes, and particles arranged in a first direction from the first electrode to the second electrode in the material, and each of the particles has a resistance lower than that of the material. A resistance of the variable resistance layer is decided by a short between the first electrode and at least one of the particles.

14 Claims, 31 Drawing Sheets

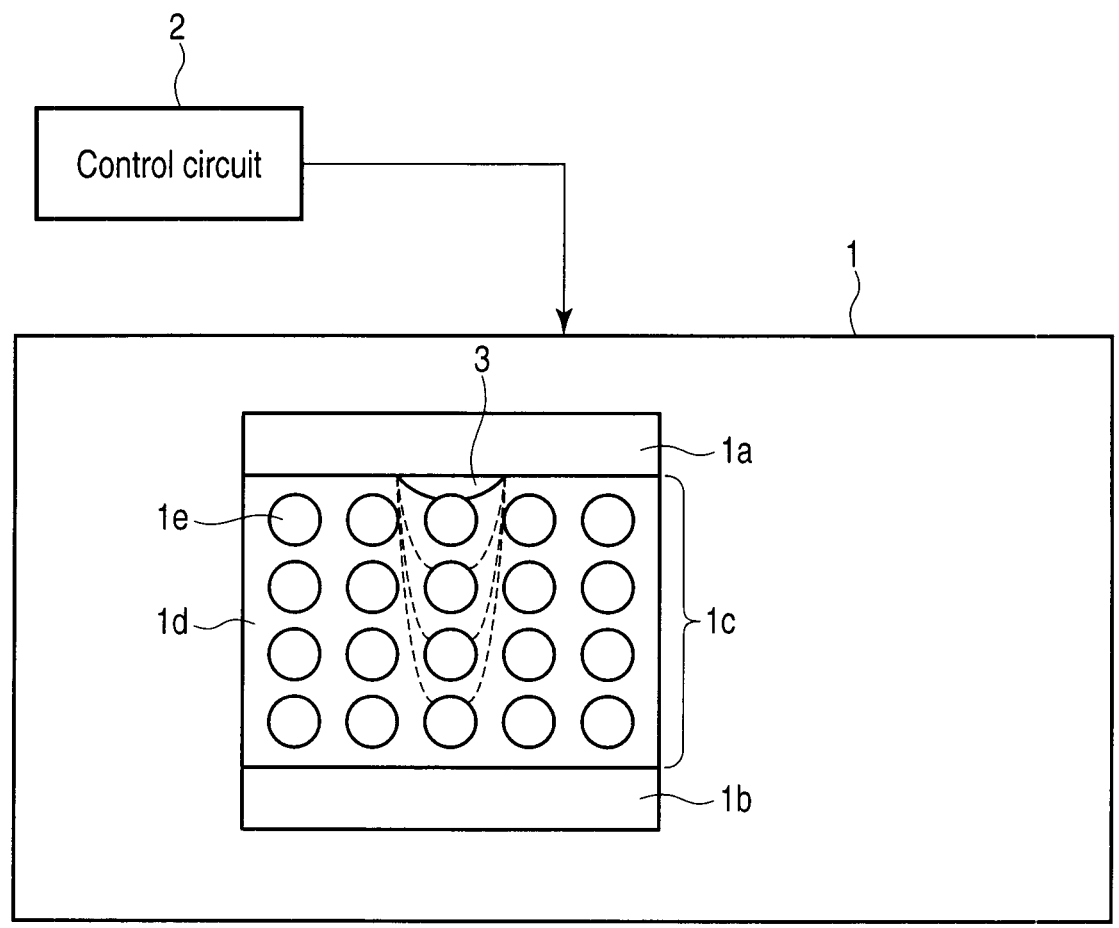
F I G. 1

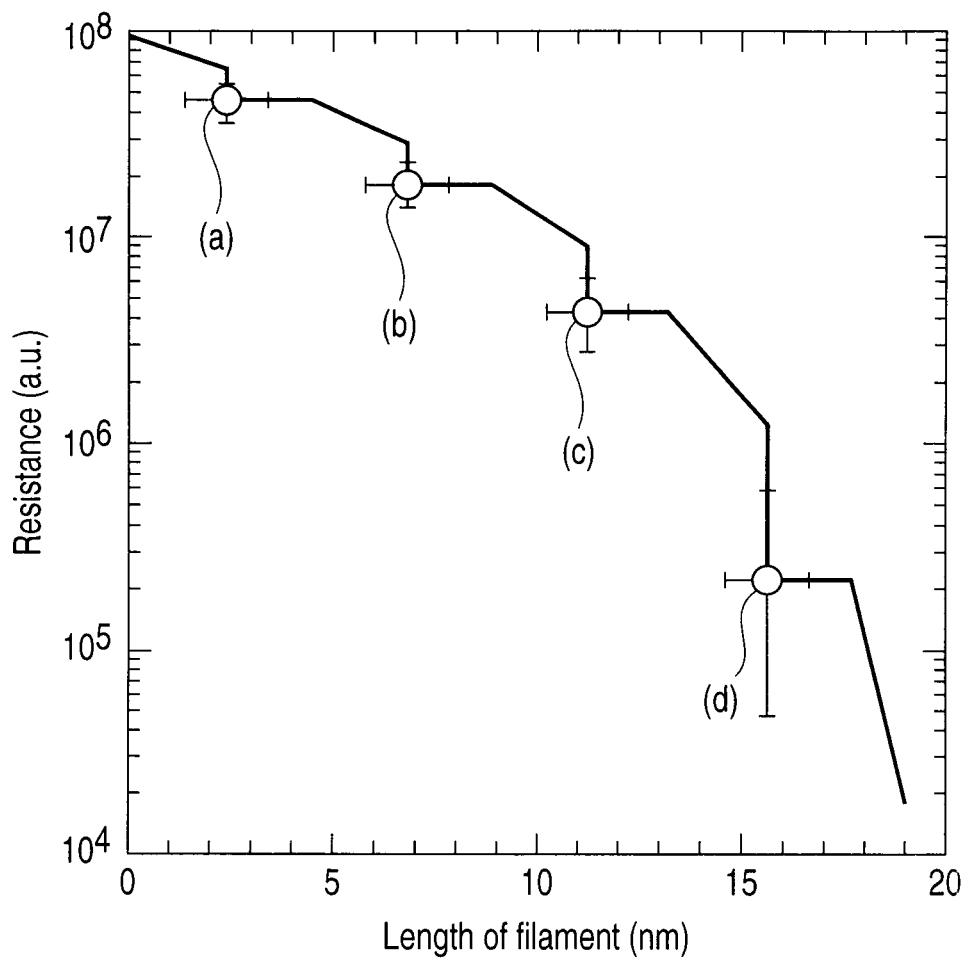
F I G. 3

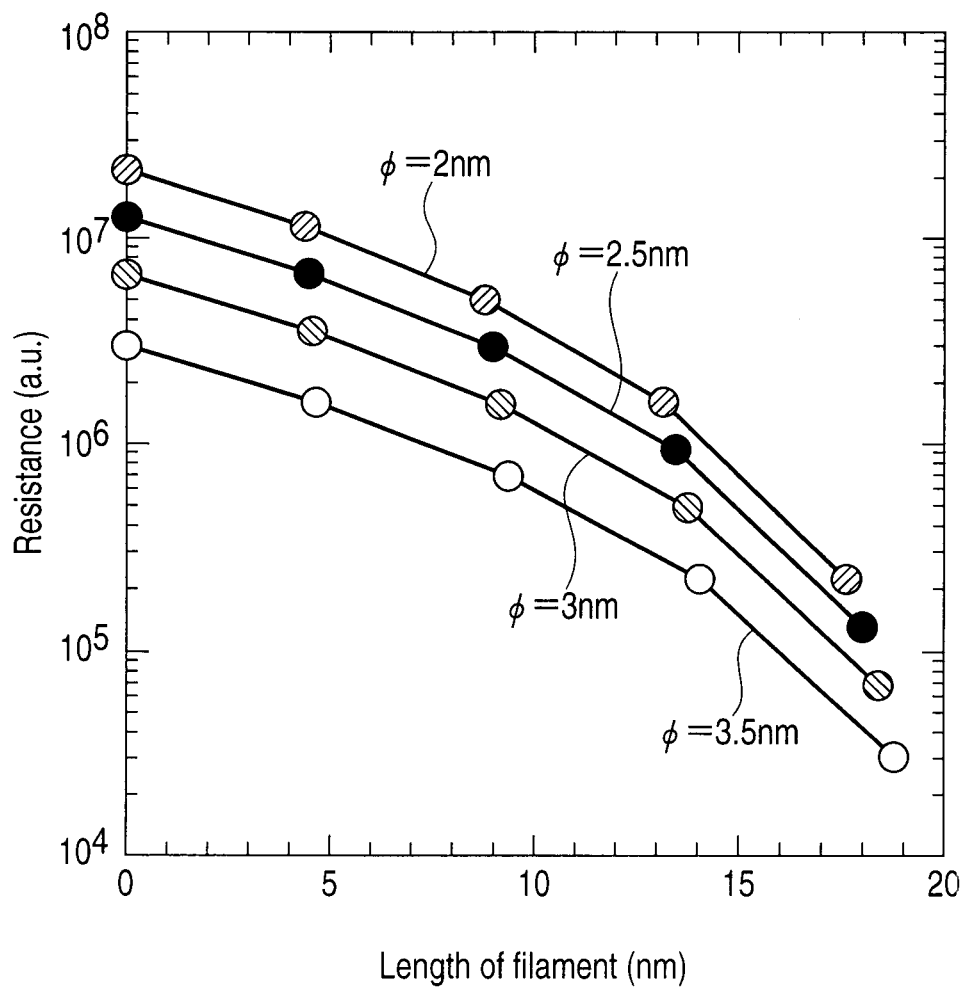
F I G. 4

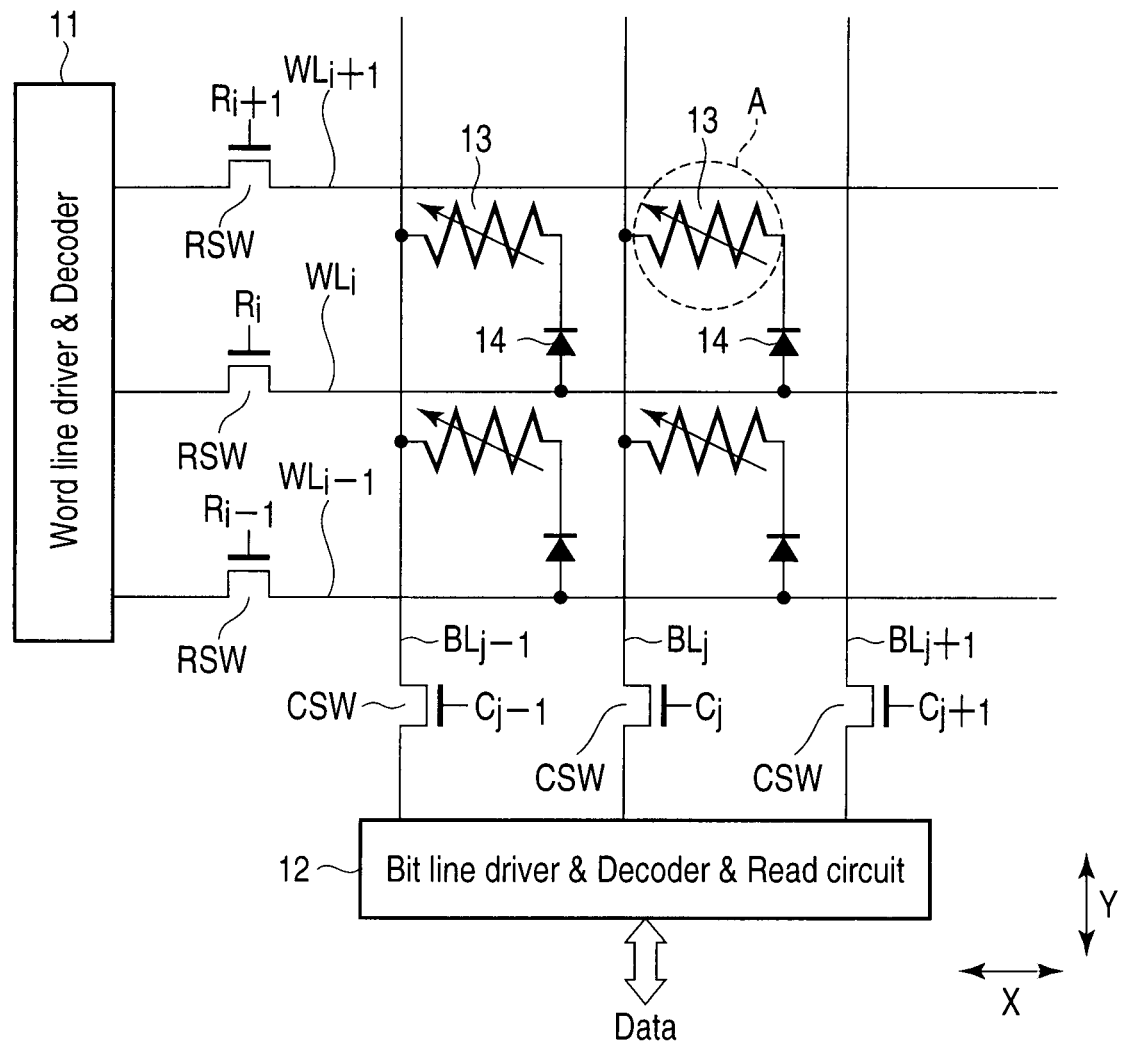
F I G. 8

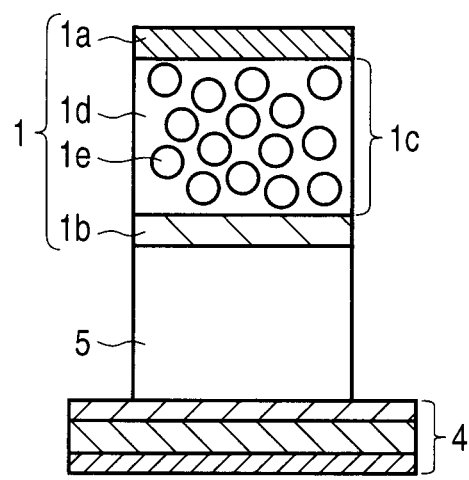
F I G. 1 4 C
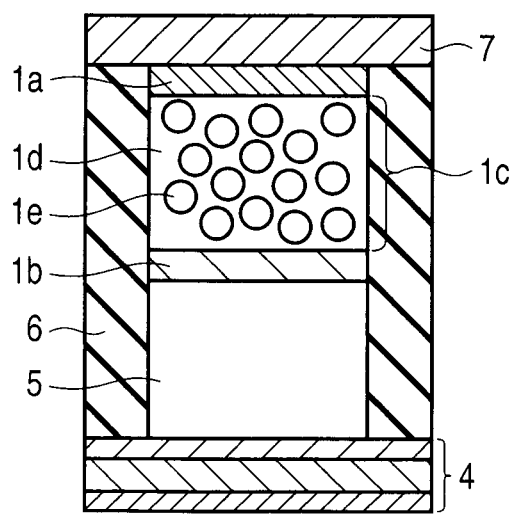
F I G. 1 4 D

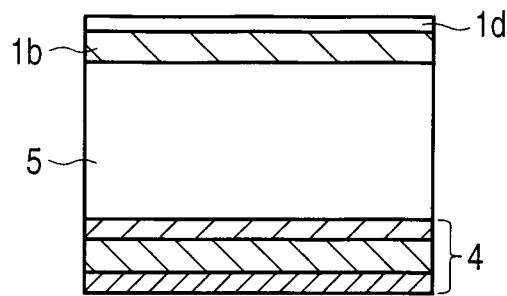
F I G. 1 5 A
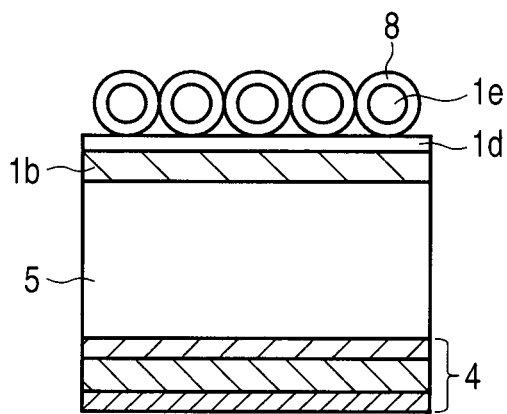
F I G. 1 5 B
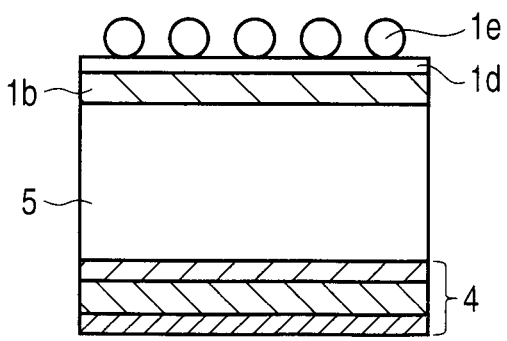
F I G. 1 5 C

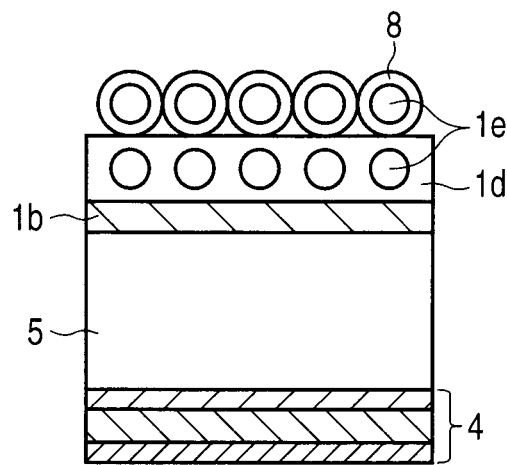
F I G. 1 5 D
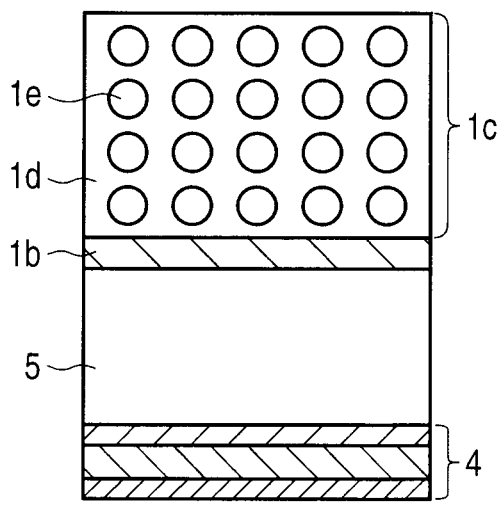
F I G. 1 5 E

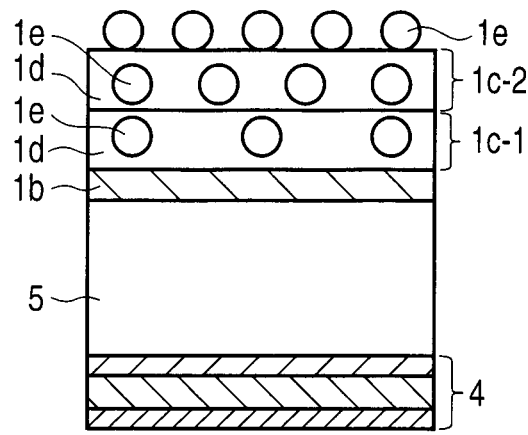
F I G. 1 6 D
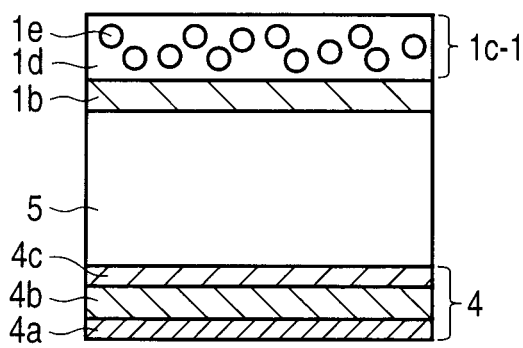
F I G. 1 7 A
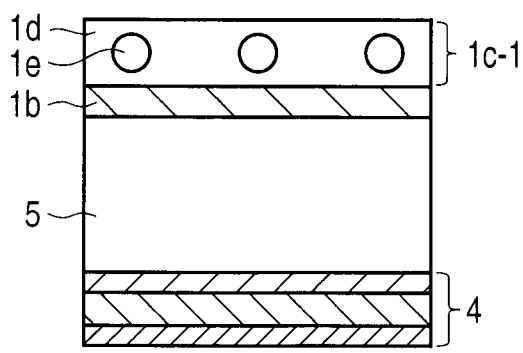
F I G. 1 7 B

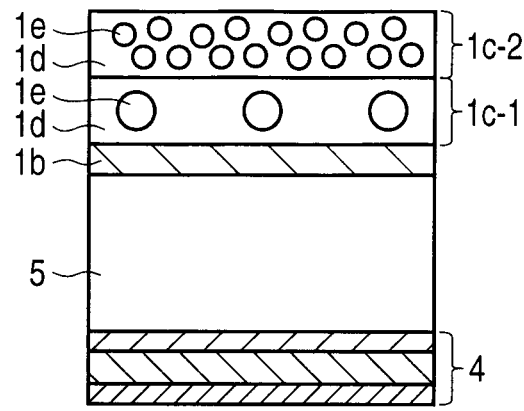
F I G. 17 C
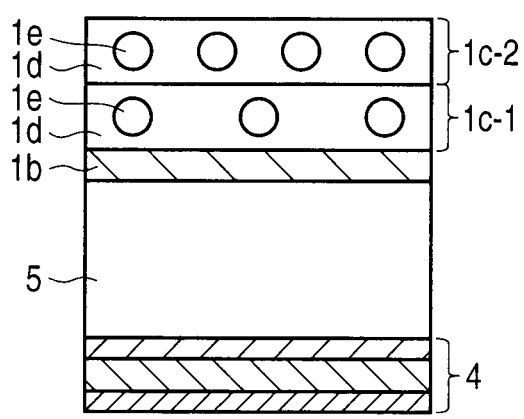
F I G. 17 D

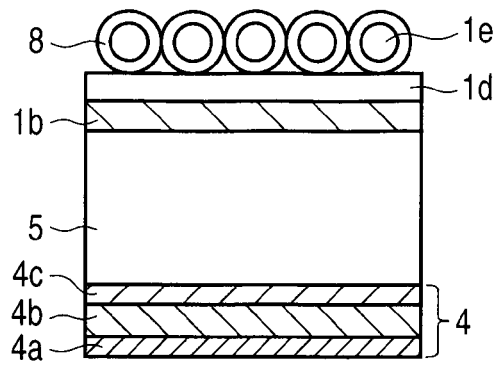
F I G. 1 9 A
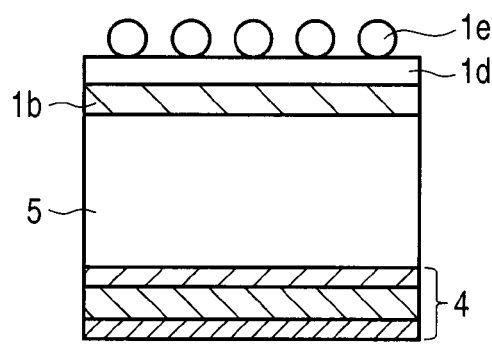
F I G. 1 9 B
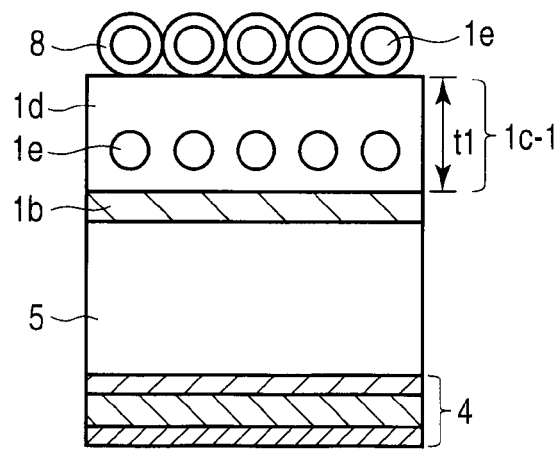
F I G. 1 9 C

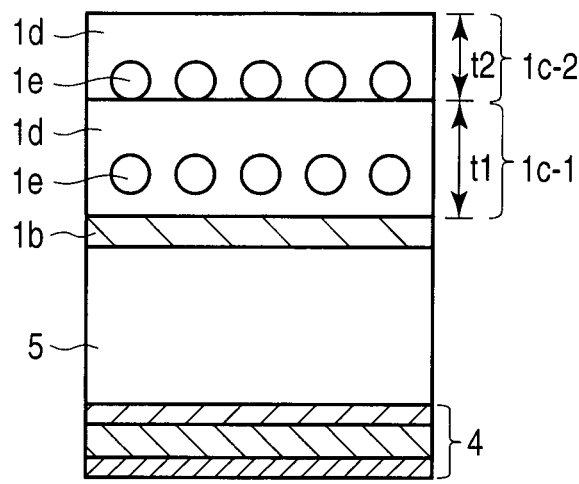
F I G. 19 D
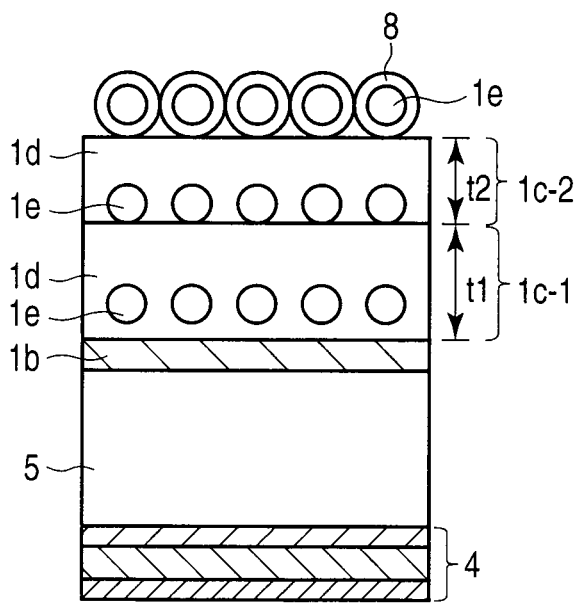
F I G. 19 E

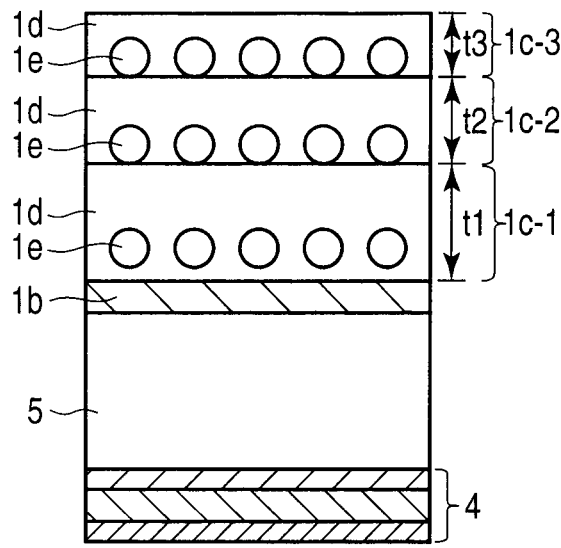
F I G. 19 F
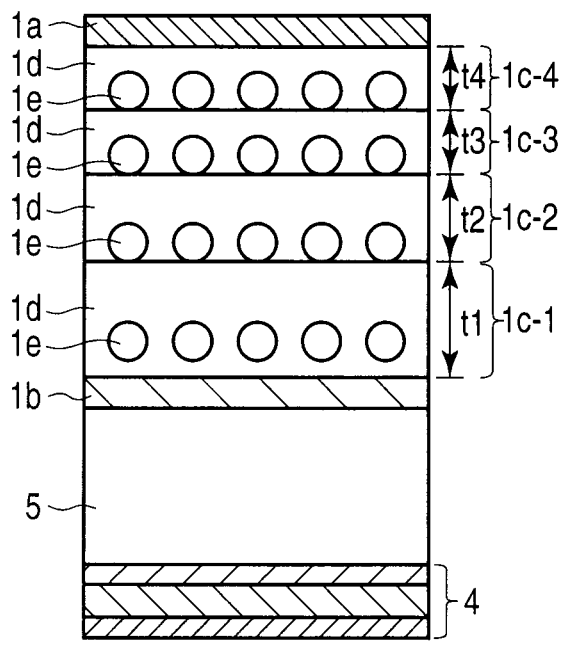
F I G. 19 G

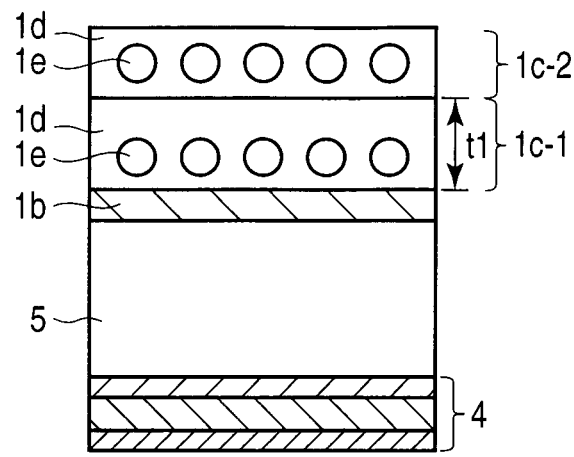
F I G. 2 0 D
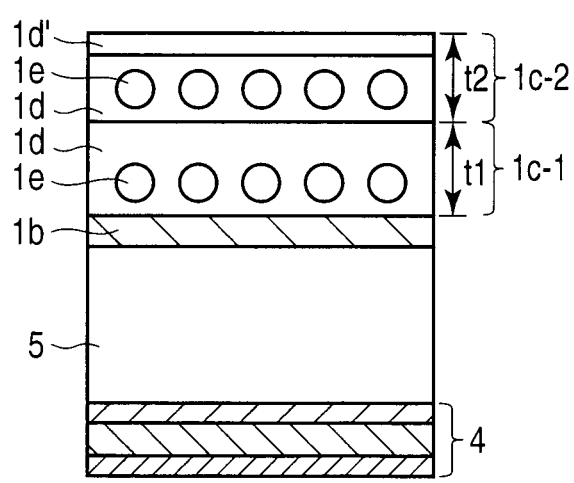
F I G. 2 0 E

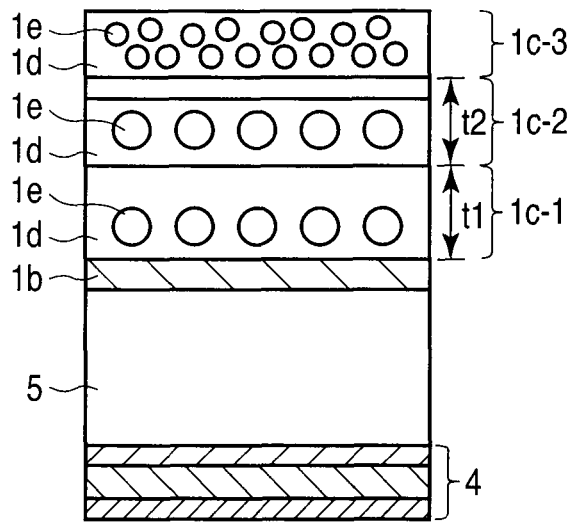
F I G. 20 F
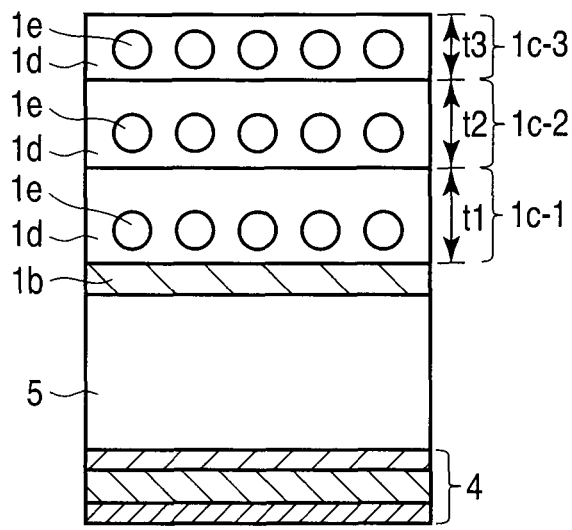
F I G. 20 G

INFORMATION RECORDING DEVICE AND METHOD OF MANUFACTURING THE SAME

CROSS-REFERENCE TO RELATED APPLICATIONS

This application is based upon and claims the benefit of priority from Japanese Patent Application No. 2010-082875, filed Mar. 31, 2010; the entire contents of which are incorporated herein by reference.

FIELD

Embodiments described herein relate generally to an information recording device and a method of manufacturing the same.

BACKGROUND

In recent years, as a next-generation large-capacity memory that substitutes for a conventional NAND type flash memory, there has been vigorously developed a resistance change type nonvolatile memory using a two-terminal element as a memory element like a PCRAM (Phase-change Random Access Memory) or an ReRAM (Resistive Random Access Memory) rather than a three-terminal element like a floating gate type memory element or an MONOS type memory element. Each of these memories stores data by arranging a memory element at an intersection of two independent conductive lines and programming resistance values (e.g., two values of high resistance (OFF) and low resistance (ON)) of the memory element by using a current or a voltage.

For example, in the PCRAM, when the memory element consists of a gallium-antimony-tellurium (GST) compound, a resistance value of the memory element varies depending on a crystalline state and an amorphous state. Further, in the ReRAM, when the memory element is a variable resistance element consisting of, e.g., $TiO_2$, a resistance value of the memory element varies depending on a state that oxygen ions in the variable resistance element move and oxygen defects are thereby continuous between electrodes and a state that the oxygen ions are again arranged in these oxygen defects.

Furthermore, as the ReRAM, one which is of a type whose resistance varies by precipitating a metal filament in a high-resistance layer between electrodes is known. For example, an ReRAM using $Cu_2S$ for the high-resistance layer corresponds to this type.

As described above, among the two-terminal elements that store data by utilizing a change in resistance of the memory element, a memory using amorphous silicon for a high-resistance layer reported in Non-patent Literature 1 attracts attention because of its high switching probability or possibility of miniaturization. According to this memory, a metal of an electrode forms a filament in an amorphous layer, and an intensity of resistance caused by this filament exercises a memory function.

In any two-terminal element, multi levels of the memory element must be realized for higher performance.

As a technology that realizes multi levels in each of the two-terminal elements, there is a current compliance control method of controlling a current amount flowing through the memory element to change a resistance value on multi levels when changing the memory level from OFF to ON.

However, in realization of multi levels by the current compliance control method, since current entry and others from a parasitic capacitance produced in the memory element largely affects reliability of the memory element, highly accurately controlling a resistance value of the memory element is difficult.

For example, the parasitic capacitance greatly affects reliability of a set operation (an operation of changing the memory element from ON to OFF), and it has been pointed out that one transistor must be added to one memory element to carry out a highly reliable operation by the current compliance control method.

However, this measure leads to an increase in size of a memory cell (the memory element+the transistor), which results in a cause that obstructs a high capacity of a resistance change type nonvolatile memory.

Therefore, realizing the multi levels in the resistance change type nonvolatile memory that realizes the multi levels by the current compliance control method is very difficult in terms of reliability. For this reason, establishment of a multi-level technology by any other control method than the current compliance control method or suggestion of a configuration of a memory element that realizes such a technology is an issue.

BRIEF DESCRIPTION OF THE DRAWINGS

FIG. 1 shows a basic concept.
FIGS. 3 to 7 show an effect of a disclosure.
FIGS. 8 to 10 show a resistance change type nonvolatile semiconductor memory.
FIGS. 14A to 14D show a first example of a manufacturing method.
FIGS. 15A to 15H show a second example of a manufacturing method.
FIGS. 16A to 16D show a third example of a manufacturing method.
FIGS. 17A to 17F show a fourth example of a manufacturing method.
FIGS. 19A to 19G show a fifth example of a manufacturing method.
FIGS. 20A to 20I show a sixth example of a manufacturing method.

DETAILED DESCRIPTION

Figure 2:
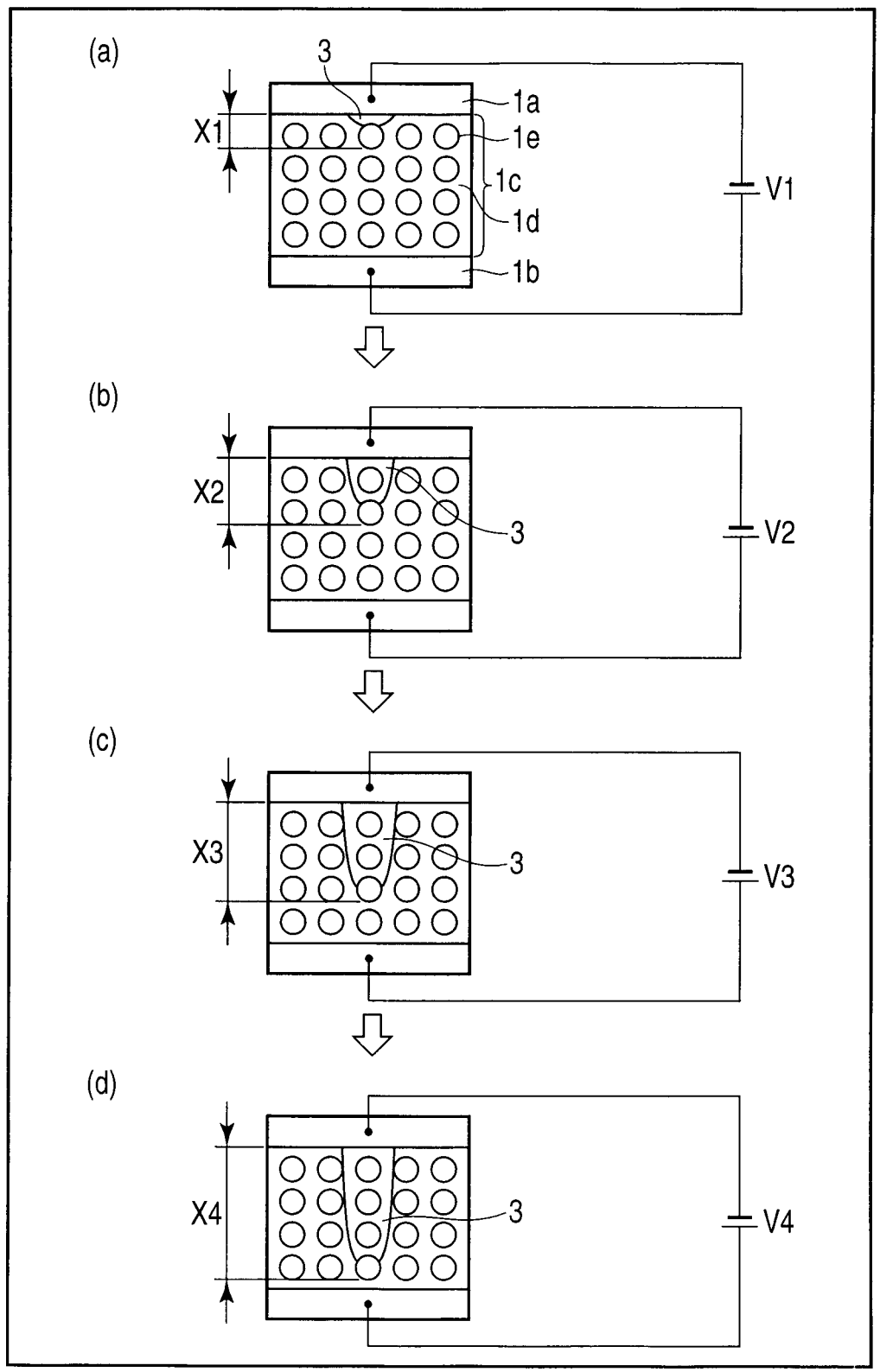
FIG. 2 shows a method of writing multilevel-data.

In general, according to one embodiment, an information recording device comprising: first and second electrodes; a variable resistance layer between the first and second electrodes; and a control circuit which controls the variable resistance layer to n (n is a natural number except 1) kinds of resistance, wherein the variable resistance layer comprises a material filled between the first and second electrodes, and particles arranged in a first direction from the first electrode to the second electrode in the material, and each of the particles has a resistance lower than that of the material, wherein a resistance of the variable resistance layer is decided by a short between the first electrode and at least one of the particles.

1. Basic Concept

FIG. 1 shows a basic concept of an information recording device.

Variable resistance element 1 includes first electrode 1a, second electrode 1b, and variable resistance layer 1c provided between these elements. Variable resistance layer 1c has high-resistance material 1d that fills a space between first and second electrodes 1a and 1b and first, second, . . . nth (n is a natural number equal to or above 2) low-resistive nano-particles 1e that have a lower resistance value than that of high-resistance material 1d and are arranged from first electrode 1a toward second electrode 1b in high-resistance material 1d.

Moreover, control circuit 2 controls a resistance value between the first and second electrodes in n patterns by short-circuiting first electrode 1a and at least one of first, second, . . . nth low-resistive nano-particles 1e.

For example, as shown in the drawing, control circuit 2 controls a length of filament 3 extending from first electrode 1a toward second electrode 1b. The length of filament 3 is controlled in n patterns from first electrode 1a to first, second, . . . nth low-resistive nano-particles 1e by changing an intensity of a voltage/current applied to the space between first and second electrodes 1a and 1b.

As a result, the resistance value between first and second electrodes 1a and 1b is digitally changed on the n stages, thus highly accurately controlling realization of multi levels (a resistance variation).

Here, the phrase "arranged from first electrode 1a toward second electrode 1b" includes a situation that the nano-particles are regularly or irregularly gradually distanced from first electrode 1a and others besides a situation that the nano-particles are aligned straightway in a direction vertical to an interface between first or second electrode 1a or 1b and variable resistance layer 1c (a film thickness direction) as shown in the drawing.

Additionally, intervals or pitches of first, second, . . . nth low-resistive nano-particles 1e may be fixed as shown in the drawing, or they may be increased as distanced from first electrode 1a (as getting closer to second electrode 1b), for example. The term "fixed" used herein includes a situation that the intervals or pitches of first, second, . . . nth low-resistive nano-particles 1e differ depending on, e.g., a production tolerance.

Although a larger difference between resistance values of high-resistance material 1d and low-resistive nano-particles 1e is desirable, the information recording device according to this embodiment can be achieved if low-resistive nano-particles 1e have a lower resistance value than that of high-resistance material 1d.

High-resistance material 1d is formed of, e.g., amorphous silicon, polycrystal silicon, or a sulfide of a metal ($Su_2S$ or AgS) High-resistance material 1d may be formed of an insulator. The low-resistive nano-particle 1e is a metallic particle or a silicide particle, and it is desirable for a size of this nano-particle to fall within the range of 0.5 nm to 100 nm.

One of first electrode 1a and second electrode 1b functions as, e.g., a lower electrode, and the other functions as an upper electrode. The lower electrode means an electrode serving as a foundation when forming variable resistance layer 1c, and the upper electrode is an electrode formed after forming variable resistance layer 1c.

Filament 3 may extend from first electrode 1a as shown in the drawing, or it may extend from second electrode 1b instead. Preferred combinations of first electrode 1a or second electrode 1b and low-resistive nano-particle 1e that can be a source of filament 3 are as follows. It is to be noted that situations that an electrode which can be a source of filament 3 is first electrode 1a will be described.

(1) When first electrode 1a consists of Ag or an alloy containing this material, first, second, . . . nth low-resistive nano-particles 1e are a material containing one of Ni, Co, Pb, Al, Ge, Mo, and W.

(2) When first electrode 1a consists of Al or an alloy containing this material, first, second, . . . nth low-resistive nano-particles 1e are a material containing one of Ge, Pb, and Ag.

(3) When first electrode 1a consists of Cu or an alloy containing this material, first, second, . . . nth low-resistive nano-particles 1e are a material containing one of Co, Nb, and Cr.

(4) When first electrode 1a consists of Ni or an alloy containing this material, first, second, . . . nth low-resistive nano-particles 1e are a material containing Ag.

(5) When first electrode 1a consists of Au or an alloy containing this material, first, second, . . . nth low-resistive nano-particles 1e are a material containing one of Co and Ni.

Meanwhile, this disclosed information recording device can perform write/erase repeating operation by reversibly changing a resistance value of variable resistance element 1 between an initial state (an erase state) and a write state (n resistance values), for example.

When performing such a reversible operation, a write operation that uniforms polarities of voltages applied to first and second electrodes 1a and 1b (a monopolar operation or a unipolar operation) and a write operation that differentiates the polarities (a bipolar operation) are known. This disclosed information recording device can be applied to both the operations.

2. Embodiments

Embodiments of this disclosed information recording device will now be described.

FIG. 2 shows a write method for multilevel data.

Variable resistance element 1 includes, e.g., lower electrode 1b, upper electrode 1a, and variable resistance layer 1c provided between these electrodes. Variable resistance layer 1c includes high-resistance material 1d and low-resistive nano-particles 1e.

Conductive lower electrode 1b can be adopted, and it is desirable for its resistivity to be 0.005 Ωcm or below. As a material of lower electrode 1b, for example, an Si layer having B, P, or As doped therein or a known electrode material such as Ti, Ta, W, or a nitride of these materials is used. Upper electrode 1a contains Ag.

Upper electrode 1a may consist of a material containing at least one of Au, Ti, Ni, Al, Fe, Cr, Cu, W, Hf, Ta, Pt, Ru, Zr, and Ir besides the material containing Ag. Further, upper electrode 1a may be a nitride or a carbide. Furthermore, upper electrode 1a may consist of an alloy material.

However, upper electrode 1a is restricted to a material different from low-resistive nano-particles 1e in variable resistance layer 1c and a material that does not alloy by a reaction with low-resistive nano-particles 1e.

High-resistance material 1d is formed of, e.g., amorphous silicon, polysilicon, or a sulfide of a metal such as $Cu_2S$ or AgS. In this example, a thickness of variable resistance layer 1c is 150 nm. However, the thickness of variable resistance value 1c is sufficient as long as it falls within the range of 2 nm to 300 nm.

Variable resistance layer 1c contains low-resistive nano-particles 1e. The low-resistive nano-particles 1e are not in contact with both upper electrode 1a and lower electrode 1b. Low-resistive nano-particles 1e are formed of metal nano-particles containing one of Ni, Co, Pb, Al, Ge, Mo, and W or silicide nano-particles containing one of Ni and Co. Low-resistive nano-particles 1e have a value falling within the range of 0.5 nm to 100 nm.

For example, a situation that high-resistance material 1d consists of amorphous silicon, upper electrode (a filament material) 1a consists of Ag, and low-resistive nano-particles 1e consist of Mo will now be considered.

First, as shown in FIG. 2(a), when voltage V1 is applied to a space between first and second electrode 1a and 1b, filament 3 grows from first electrode 1a side that serves as a cathode and comes into contact with low-resistive nano-particle (a first low-resistive nano-particle) 1e placed at the position closest to first electrode 1a. At this point in time, a resistance value between first and second electrodes 1a and 1b is precipitously lowered. Then, the resistance value between first and second electrodes 1a and 1b does not change until filament 3 reaches effective filament length X1.

Subsequently, as shown in FIG. 2(b), when voltage V2 (>V1) is applied to the space between first and second electrodes 1a and 1b, filament 3 further grows from first electrode 1a side that serves as the cathode, and it comes into contact with low-resistive nano-particle (a second low-resistive nano-particle) 1e placed at the second closest position from first electrode 1a. At this point in time, the resistance value between first and second electrodes 1a and 1b is again precipitously reduced. Thereafter, the resistance value between first and second electrodes 1a and 1b does not change until filament 3 reaches effective filament length X2.

Subsequently, as shown in FIG. 2(c), when voltage V3 (>V2) is applied to the space between first and second electrodes 1a and 1b, filament 3 further grows from first electrode 1a side that serves as the cathode, and it comes into contact with low-resistive nano-particle (a third low-resistive nano-particle) 1e placed at the third closest position from first electrode 1a. At this point in time, the resistance value between first and second electrodes 1a and 1b is again precipitously reduced. Thereafter, the resistance value between first and second electrodes 1a and 1b does not change until filament 3 reaches effective filament length X3.

At last, as shown in FIG. 2(d), when voltage V4 (>V3) is applied to the space between first and second electrodes 1a and 1b, filament 3 further grows from first electrode 1a side that serves as the cathode, and it comes into contact with low-resistive nano-particle (a fourth low-resistive nano-particle) 1e placed at the farthest position from first electrode 1a. At this point in time, the resistance value between first and second electrodes 1a and 1b is again precipitously reduced. Thereafter, the resistance value between first and second electrodes 1a and 1b does not change until filament 3 reaches effective filament length X4.

As described above, the resistance value between first and second electrodes 1a and 1b digitally discontinuously changes.

It is to be noted that the length of the filament is controlled based on an intensity of the voltage, but the length of the filament can be also controlled based on a time for applying a voltage (e.g., a pulse width) or a number of times of applying a voltage while fixing a voltage value.

FIG. 3 shows a relationship between the length of the filament and a change in resistance value.

Here, a situation where low-resistive nano-particles having a diameter of 2 nm are homogeneously contained in amorphous silicon of 20 nm will be described.

A resistance value indicated by (a) in FIG. 3 corresponds to a state depicted in FIG. 2(a), a resistance value indicated by (b) in FIG. 3 corresponds to a state depicted in FIG. 2(b), a resistance value indicated by (c) in FIG. 3 corresponds to a state depicted in FIG. 2(c), and a resistance value indicated by (d) in FIG. 3 corresponds to a state depicted in FIG. 2(d).

As apparent from the drawing, when the high-resistance material contains the low-resistive nano-particles, a resistance change becomes discontinuous with respect to the filament length, and a region where the resistance value is fixed can be created, thereby highly accurately controlling multi levels even in a write operation using the current compliance method, for example.

Moreover, since a region where the resistance value does not change depending on the filament length is provided, even if the filament length slightly varies at the time of a data hold operation or a read operation, a change in resistance value is suppressed, and multilevel data can be highly reliably stored.

Although the description has been given as to the example where the low-resistive nano-particle are regularly aligned here, the same effect can be obtained even if the low-resistive nano-particles are randomly aligned. However, as compared with the situation where these nano-particles are regularly aligned, the resistance value fluctuates depending on a position of the low-resistive nano-particle that comes into contact with the filament.

The fluctuation at this moment is represented as an error bar of the filament length and the resistance value at each point of (a) to (d) in FIG. 3. At each point, since a resistance change before and after the filament comes into contact with the low-resistive nano-particle is larger than the fluctuation (the error bar) at each point, it can be understood that multi levels can be sufficiently realized even though the low-resistive nano-particles are randomly aligned.

FIG. 4 shows resistance changes when a particle diameter $\phi$ of the low-resistive nano-particles is changed to 2 nm, 2.5 nm, 3 nm, and 3.5 nm. In any case, the first low-resistive nano-particle to the fourth low-resistive nano-particle are arranged in a direction along which the filament extends, and each data point indicates a resistance value when the filament comes into contact with each low-resistive nano-particle.

An ON/OFF ratio decreases as the particle diameter $\phi$ of the low-resistive nano-particles increases, but this means that four levels can be realized.

Figure 5:
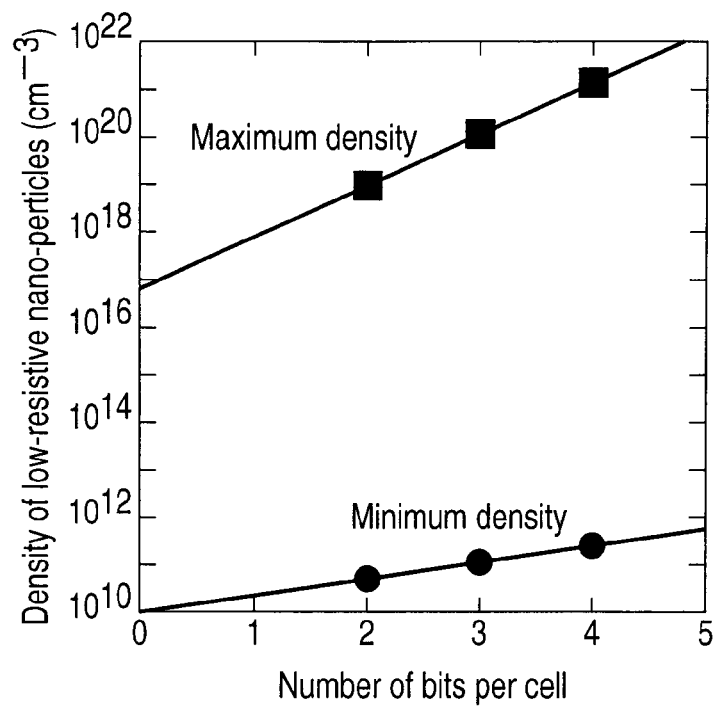

FIG. 5 is a view showing a relationship between a density of the low-resistive nano-particles (defined as the number of nano-particles per $cm^3$) and realization of multi levels.

For example, in four levels (2 bits/cell), eight levels (3 bits/cell), and 16 levels (4 bits/cell), a region surrounded by lines of a minimum density and a maximum density of the metal particles corresponds to a density optimum for realization of multi levels.

Specifically, the metal particle density is not lower than $4.8 \times 10^{10}$ pieces/$cm^3$ and not greater than $8.8 \times 10^{18}$ pieces/$cm^3$ in four levels, the metal particle density is not lower than $1.11 \times 10^{11}$ pieces/$cm^3$ and not greater than $1.3 \times 10^{20}$ pieces/$cm^3$ in eight levels, and the metal particle density is not lower than $2.4 \times 10^{11}$ pieces/$cm^3$ and not greater than $1.3 \times 10^{21}$ pieces/$cm^3$. It is to be noted that the metal particle density can be analyzed by using, e.g., a transmission electron microscope.

Figure 6:
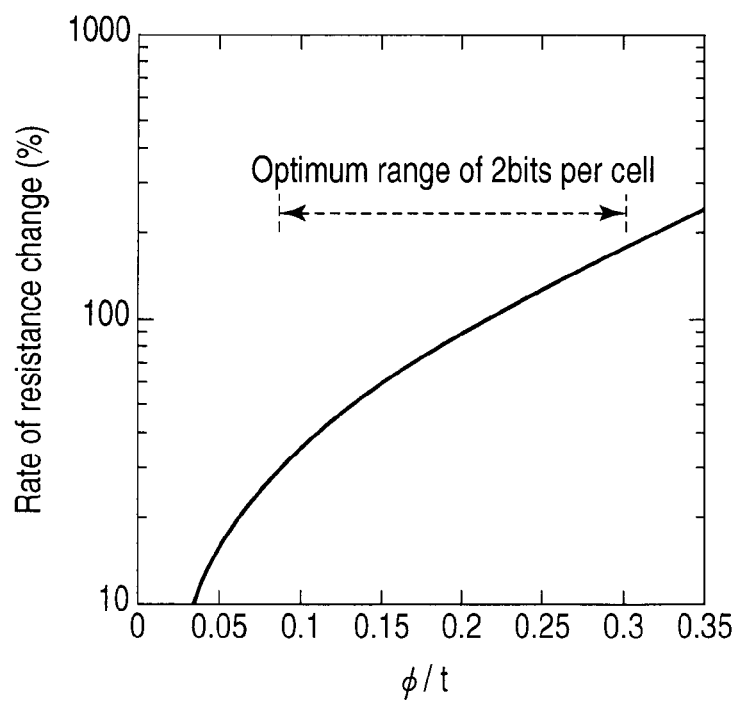

FIG. 6 shows a relationship between a size of the low-resistive nano-particles (a ratio of a thickness t of the variable resistance layer and the particle diameter $\phi$ of the low-resistive nano-particles) and a resistance change rate when the filament has come into contact with the low-resistive nano-particle.

In this example, the resistance change rate is defined as a value obtained by dividing a resistance difference between a resistance value immediately before contacting with the low-resistive nano-particles (dots) and a resistance value when contacting with the low-resistive nano-particles by the resistance value when contacting with the low-resistive nano-particles, i.e., [(the resistance value immediately before contacting with dots)–(the resistance value when contacting with the dots)]/(the resistance value when contacting with the dots)].

Based on this drawing, an optimum particle diameter of the low-resistive nano-particle can be determined from a thickness of the variable resistance layer and a rate of resistance change. For example, in four levels, considering a variation in each memory level, a value in the range of 30% to 180% is desirable for the rate of resistance change, and a value in the range of 0.08 to 0.31 is desirable for a ratio of [a dot particle diameter/a thickness of the variable resistance layer] realizing this rate.

Here, although the example where the size of the low-resistive nano-particles is fixed in the film thickness direction has been explained, the embodiment is not restricted thereto, and the same effect can be obtained even if the low-resistive nano-particles having sizes that differ in the film thickness direction are arranged. Further, the example where the distribution of the low-resistive nano-particles in the film thickness direction of the variable resistance layer is homogeneous has been explained, but the embodiment is not restricted thereto, and intervals between the low-resistive nano-particles may be changed in the film thickness direction.

Furthermore, although the example where the four levels are realized by arranging the four low-resistive nano-particles in the film thickness direction of the variable resistance layer has been described, but multi levels exceeding the four levels can be realized by increasing the number of the low-resistive nano-particles arranged in the film thickness direction.

Figure 7:
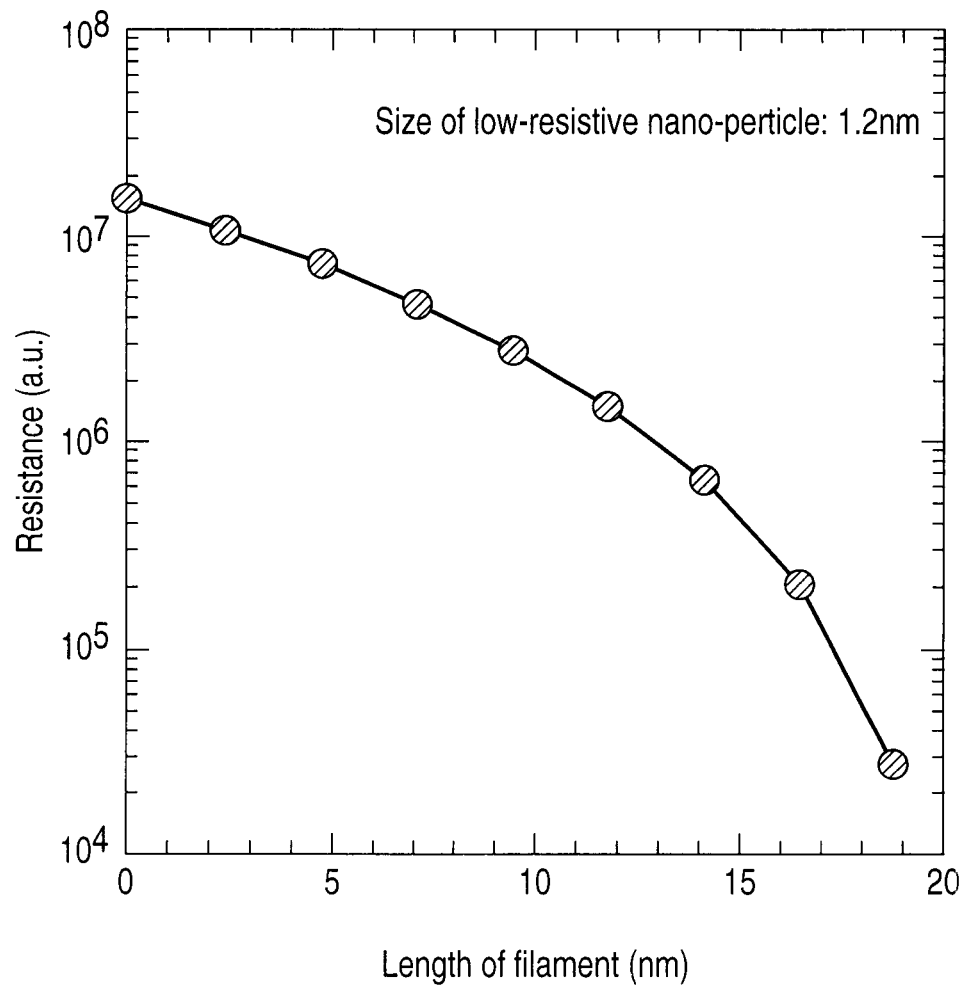

FIG. 7 shows an example where low-resistive nano-particles having a particle diameter of 1.2 nm are homogeneously aligned in a variable resistance layer of 20 nm and eight low-resistive nano-particles are arranged in a film thickness direction of the variable resistance layer.

Here, although amorphous silicon is used as a high-resistance material in the variable resistance layer, the embodiment is not restricted thereto, and the same effect can be obtained even if a compound layer consisting of single-crystal silicon, polycrystal silicon, or a non-metallic oxide such as a copper sulfide is used.

Furthermore, although Ag is used for the filament and Mo is used for the low-resistive nano-particles, the embodiment is not restricted thereto, and a first electrode serving as the filament may consist of one of Al, Au, Cr, Cu, Ti, and Ni, and the low-resistive nano-particles may consist of one of Ni, Cu, Pb, Ti, Al, Co, Nb, Ge, W, Pb, and Cr or a silicide of these materials.

However, when an element constituting the filament is equal to an element constituting the low-resistive nano-particles, excellent ON/OFF characteristics cannot be obtained, different types of elements must be used.

When the low-resistive nano-particles contain an element constituting the filament, for example, when the low-resistive nano-particles consist of a silicide of a metal constituting the filament, this configuration can be adopted in this disclosed information recording device under the condition that the excellent ON/OFF characteristics can be obtained.

Moreover, when the filament and the low-resistive nano-particles are alloyed, since excellent ON/OFF characteristics cannot be obtained, desirable combinations of elements are (the filament—the low-resistive nano-particles)=(Ag—Ni), (Ag—Co), (Ag—Pb), (Ag—Ge), (Ag—Mo), (Ag—W), (Al—Ge), (Al—Pb), (Al—Ag), (Au—Co), (Au—Ni), (Co—Cu), (Cr—Cu), (Cu—Nb), (Ge—Pb), and others.

In particular, when using silicon such as amorphous silicon as a high-resistance material, adopting the following materials is desirable. That is, the low-resistive nano-particles in the high-resistance material may consist of one of Pb, Al, Ge, and Mo when the first electrode that is a source of filament 3 consists of Ag, the low-resistive nano-particles in the high-resistance material may consist of one of Ge, Pb, and Ag when the first electrode consists of Al, the low-resistive nano-particles in the high-resistance material may consist of one of Nb and Cr when the first electrode consists of Cu, and the low-resistive nano-particles in the high-resistance material may consist of Ag when the first electrode consists of Ni.

3. Application Examples

Application examples of this disclosed information recording device will now be described.

(1) Resistance Change Type Nonvolatile Semiconductor Memory

A resistance change type nonvolatile semiconductor memory means a semiconductor memory that utilizes a variable resistance element as a recording medium. The variable resistance element described herein means a variable resistance element concerning this disclosure, i.e., an element whose resistance value varies due to a voltage, a current, heat, and the like.

FIG. 8 shows a resistance change type nonvolatile semiconductor memory to which this disclosed information recording device is applied.

A memory cell array has a cross point type.

Word lines $WL_{i-1}$, $WL_i$, and $WL_{i+1}$ extend in an X direction, and bit lines $BL_{j-1}$, $BL_j$, and $BL_{j+1}$ extend in a Y direction.

One end of each of word lines $WL_{i-1}$, $WL_i$, and $WL_{i+1}$ is connected to word line driver & decoder 11 through MOS transistor RSW as a selection switch, and one end of each of bit lines $BL_{j-1}$, $BL_j$, and $BL_{j+1}$ is connected to bit line driver & decoder 12 through MOS transistor CSW as a selection switch.

Each of selection signals $R_{i-1}$, $R_i$, and $R_{i+1}$ utilized to select one word line (a row) is input to a gate of MOS transistor RSW, and each of selection signals $C_{j-1}$, $C_j$, and $C_{j+1}$ utilized to select one bit line (a column) is input to a gate of MOS transistor CSW.

Memory cell 13 is arranged at an intersection of word line $WL_{i-1}$, $WL_i$, or $WL_{i+1}$ and bit line $BL_{j-1}$, $BL_j$, or $BL_{j+1}$. This is a so-called cross point type cell array structure.

Diode 14 configured to avoid a sneak current at the time of recording/reproduction is added to memory cell 13.

Figure 9:
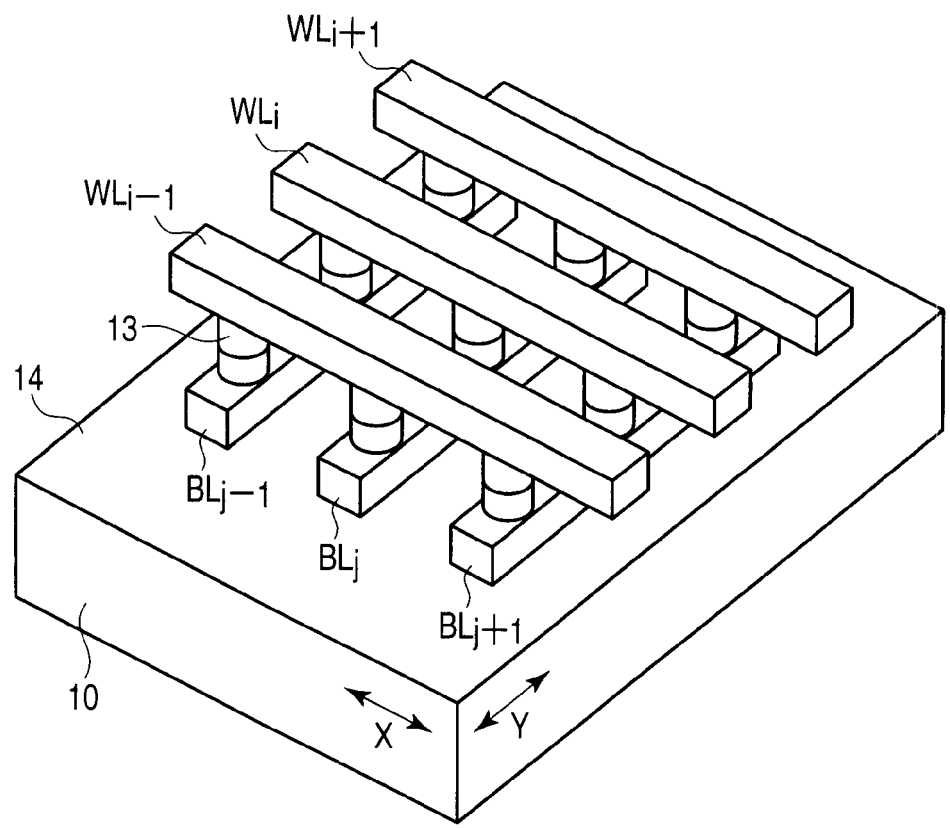

FIG. 9 shows a structure of a memory cell array unit depicted in FIG. 8.

Word lines $WL_{i-1}$, $WL_i$, and $WL_{i+1}$ and bit lines $BL_{j-1}$, $BL_j$, and $BL_{j+1}$ are arranged on semiconductor substrate 10, and memory cell 13 and diode 14 are connected to each intersection of these wiring lines in series.

Such a cross point type cell array structure is characterized in that this structure is advantageous for realization of high integration since each MOS transistor does not have to be connected to memory cell 13. For example, memory cells 13 may be stacked to provide a three-dimensional memory cell array structure.

Figure 10:
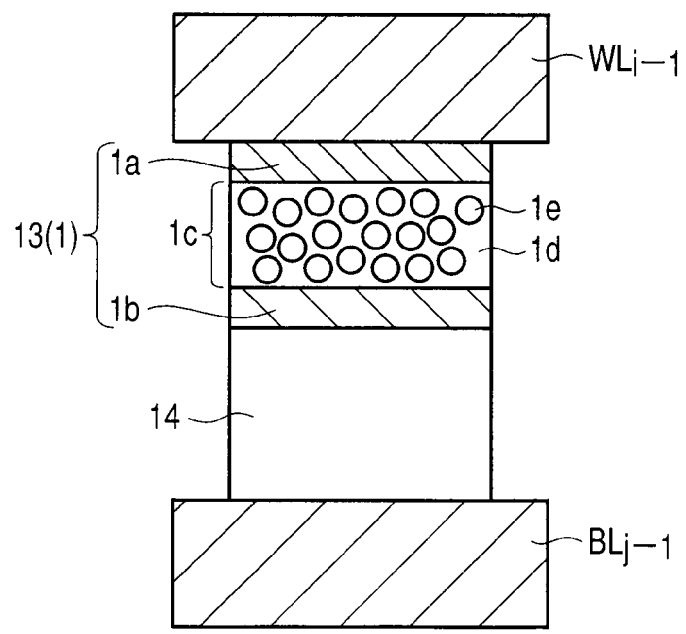

Memory cell 13 is, e.g., this disclosed variable resistance element 1 as shown in FIG. 10. Therefore, one memory cell 13 stores multilevel data having three levels or more. Further, as diode 14, a PIN (SIS) diode, an MIS diode, or an MIS diode may be used besides a PN junction diode.

It is to be noted that diode 14 can be omitted when changing set/reset based on a direction/intensity of a voltage alone.

Figure 22:
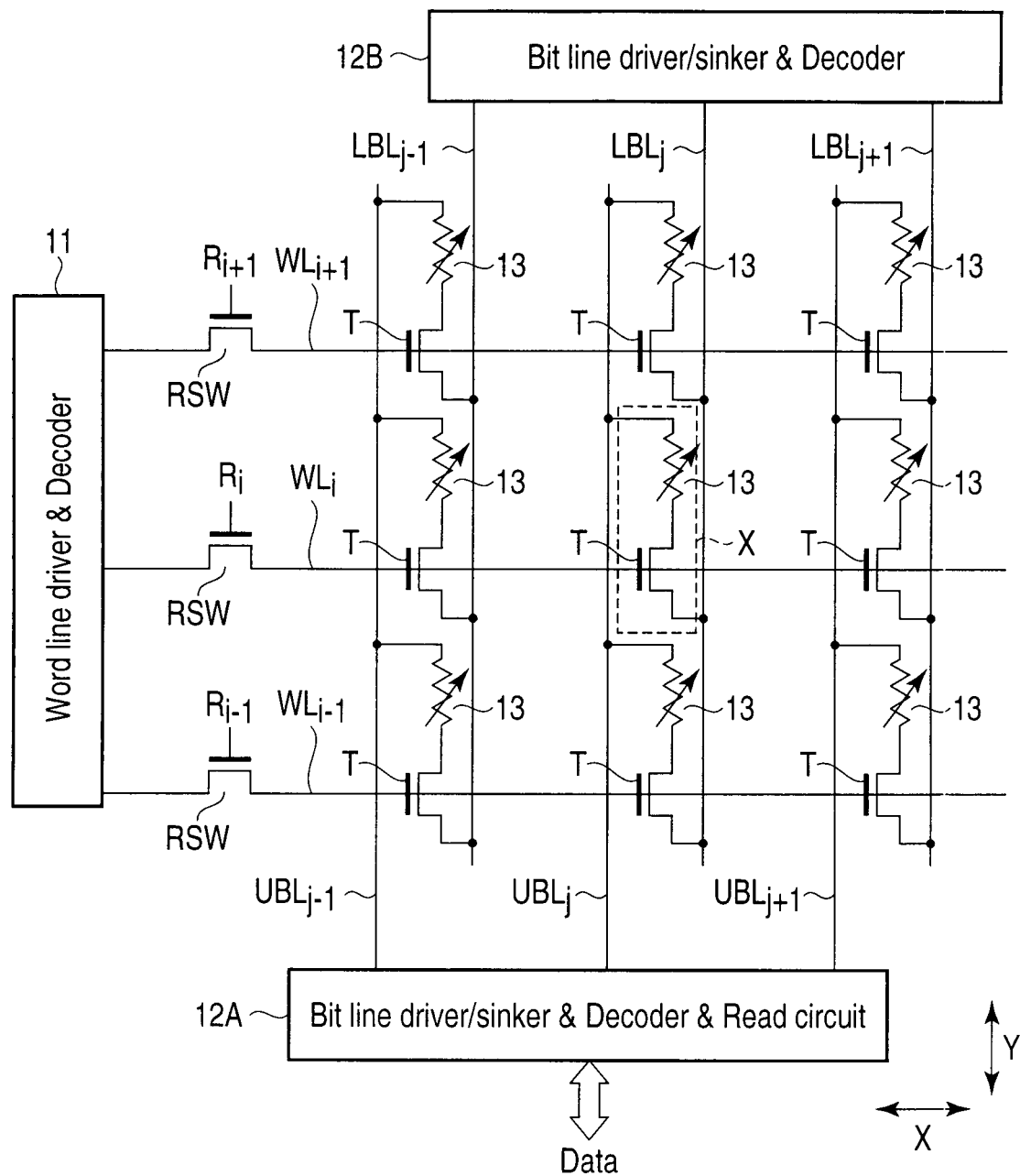
FIGS. 22 and 23 show a resistance change type nonvolatile semiconductor memory.

FIG. 22 shows another example of the resistance change type nonvolatile semiconductor memory.

A memory cell array has a one transistor-one element type.

Word lines $WL_{i-1}$, $WL_i$, and $WL_{i+1}$ extend in an X direction, and bit lines $UBL_{j-1}$, $UBL_j$, $UBL_{j+1}$, $LBL_{j-1}$, $LBL_j$, and $LBL_{j+1}$ extend in a Y direction.

One end of each of word lines $WL_{i-1}$, $WL_i$, and $WL_{i+1}$ is connected to word line driver & decoder 11 through MOS transistor RSW as a selection switch, one end of each of bit lines $UBL_{j-1}$, $UBL_j$, and $UBL_{j+1}$ is connected to bit line driver/sinker & decoder & read circuit 12A, and one end of each of bit lines $LBL_{j-1}$, $LBL_j$, and $LBL_{j+1}$ is connected to bit line driver/sinker & decoder 12B.

Each of selection signals $R_{i-1}$, $R_i$, and $R_{i+1}$ utilized to select one word line (a row) is input to a gate of MOS transistor RSW. Bit line driver/sinker & decoder & read circuit 12A has a function of selecting one of bit lines $UBL_{j-1}$, $UBL_j$, and $UBL_{j+1}$, and bit line driver/sinker & decoder 12B has a function of selecting one of bit lines $LBL_{j-1}$, $LBL_j$, and $LBL_{j+1}$.

One end of memory cell 13 is connected to each of bit lines $UBL_{j-1}$, $UBL_j$, and $UBL_{j+1}$, and the other end of the same is connected to each of bit lines $LBL_{j-1}$, $LBL_j$, and $LBL_{j+1}$ through a source/drain of MOS transistor T. A gate of MOS transistor T is connected to each of word lines $WL_{i-1}$, $WL_i$, and $WL_{i+1}$.

In this structure, since one MOS transistor T is connected to one memory cell 13, a sneak current that is a problem in the cross point type shown in FIG. 8 does not occur, thereby improving reliability of read/write operations.

Figure 23:
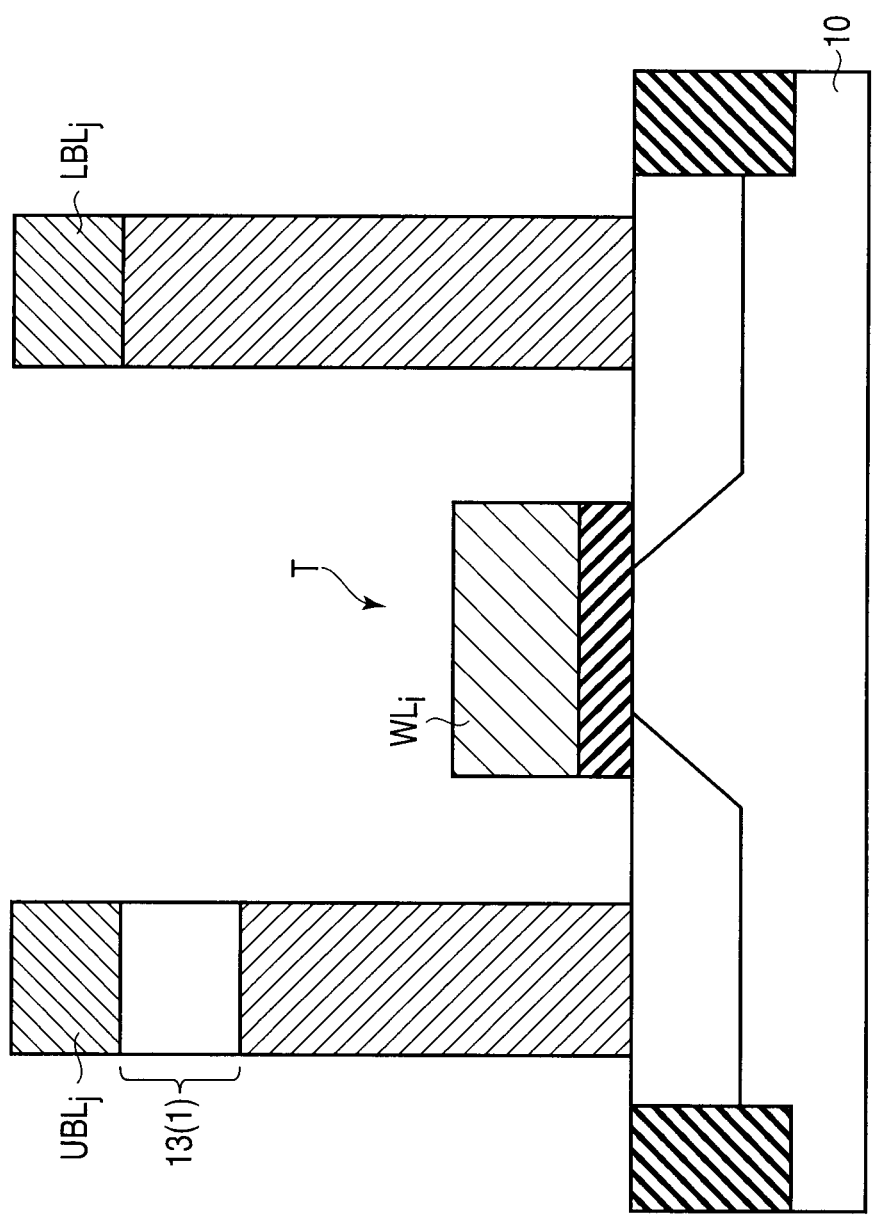

FIG. 23 shows a structure of an X portion in the memory cell array depicted in FIG. 22.

MOS transistor T is formed on semiconductor substrate 10. One of the source/drain of MOS transistor T is connected to bit line $UBL_j$ through memory cell 13(1). The other of the source/drain of MOS transistor T is connected to bit line $LBL_j$.

Memory cell 13(1) is, e.g., a variable resistance element having the same configuration as memory cell 13(1) depicted in FIG. 10. Therefore, one memory cell 13 can store multilevel data having three levels or more.

Such a one transistor-one cell type is characterized in that each MOS transistor is connected to memory cell 13, thereby improving reliability of read/write operations. Furthermore, high integration of memory cell 13 can be realized by elaborating a layout and others of word lines $WL_{i-1}$, $WL_i$, and $WL_{i+1}$ or bit lines $UBL_{j-1}$, $UBL_j$, $UBL_{j+1}$, $LBL_{j-1}$, $LBL_j$, and $LBL_{j+1}$.

(2) Probe Memory

A probe memory means a memory that adopts a variable resistance element as a recording medium and uses a probe (a head) to gain access. The variable resistance element described herein means a variable resistance element according to this disclosure, i.e., an element whose resistance value changes due to a voltage, a current, heat, and the like.

Figure 11:
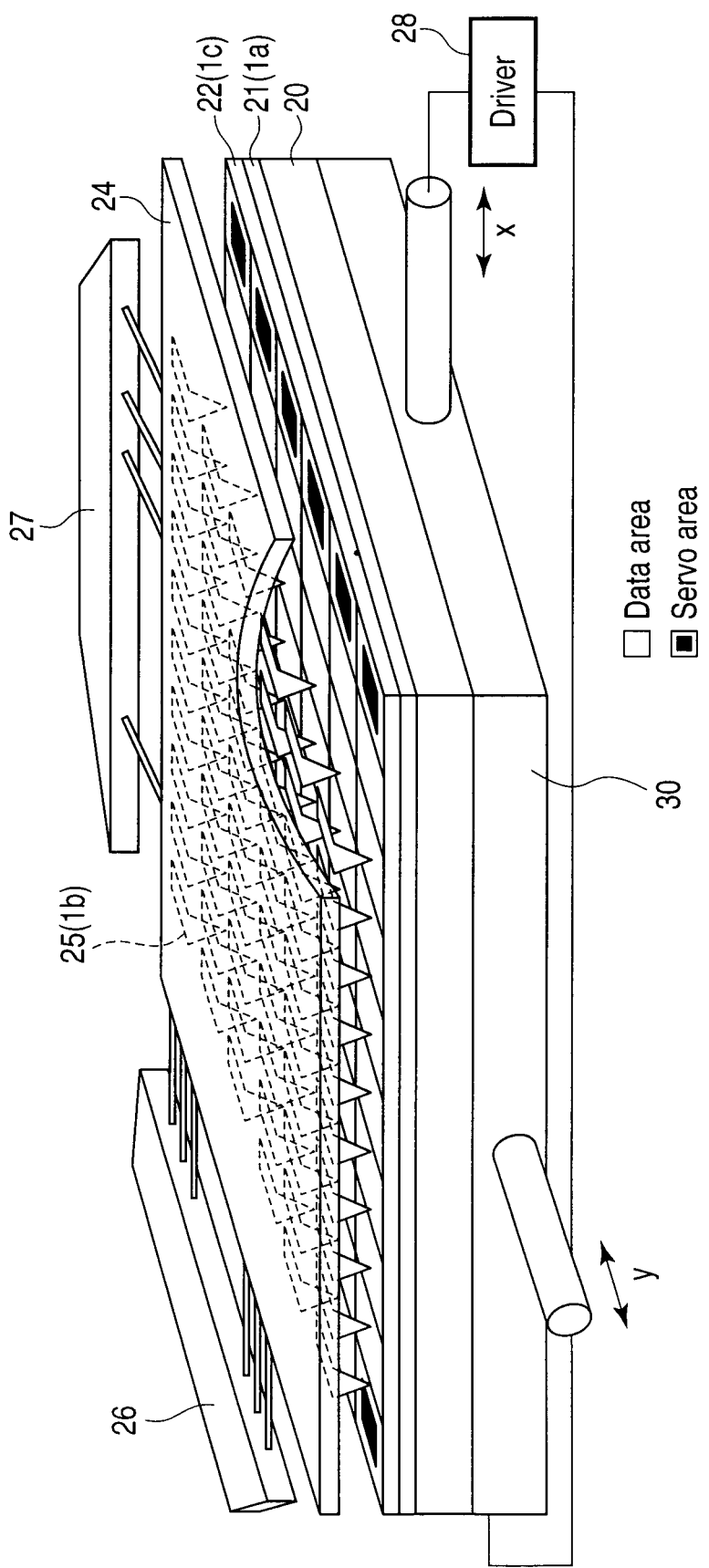
FIGS. 11 to 13 show a probe memory.
Figure 12:
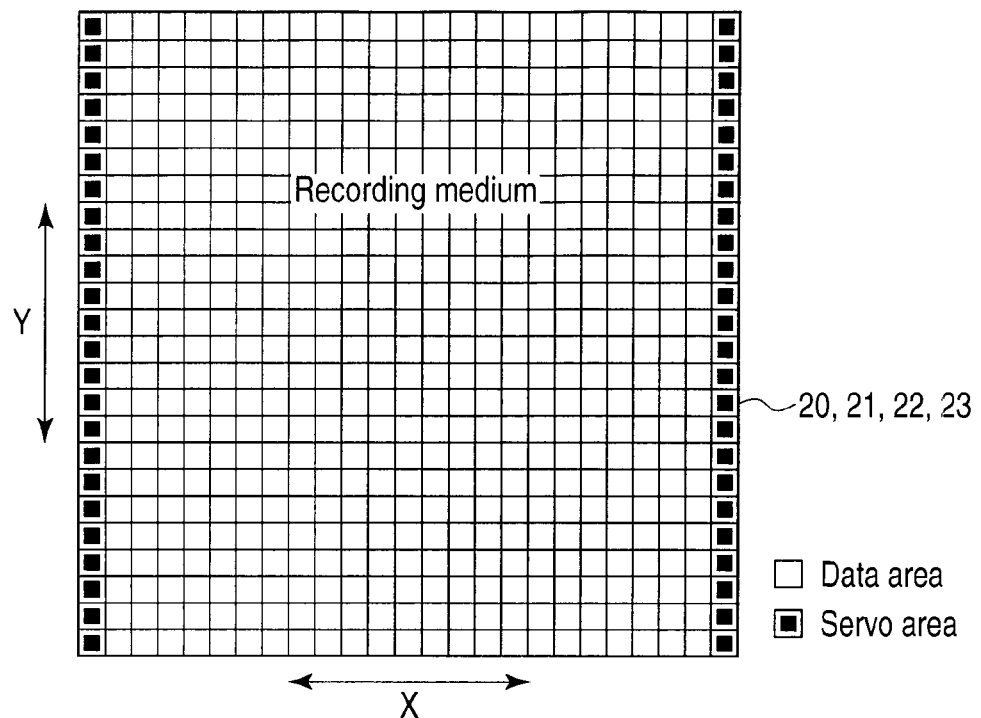

FIG. 11 and FIG. 12 show a probe memory.

A recording medium is arranged on XY scanner 30. A probe array is arranged to face this recording medium.

The probe array has semiconductor substrate 24 and probes (heads) 25 arranged on one surface side of semiconductor substrate 24 in an array form. Each of probes 25 is constituted of, e.g., a cantilever and driven by multiplex drivers 26 and 27.

Although each of probes 25 can be individually operated by using a microactuator in semiconductor substrate 24, an example where all the probes are simultaneously operated in the same manner to access a data area of the recording medium will be explained.

First, multiplex drivers 26 and 27 are utilized to reciprocate all probes 25 in an X direction in a fixed cycle, thereby reading out positional information in a Y direction from a servo area of the recording medium. The positional information in the Y direction is transferred to driver 28.

Driver 28 drives XY scanner 30 based on this positional information to move the recording medium in the Y direction, thereby positioning the recording medium and the probes.

After completion of the positioning of both the members, data is continuously read from or written into all probes 25 in the data area at the same time.

The data read or write operation is continuously carried out since probes 25 reciprocate in the X direction. Furthermore, the data read and write operation is performed with respect to each line in the data area by sequentially changing a position of the recording medium in the Y direction.

It is to be noted that the recording medium may be reciprocated in a fixed cycle to read the positional information from the recording medium and probes 25 may be moved in the Y direction.

The recording medium is constituted of, e.g., semiconductor substrate 20, electrode layer 21 on semiconductor substrate 20, and recording material layer 22 on electrode layer 21.

Electrode layer 21 corresponds to, e.g., first electrode 1a in FIG. 1.

Recording material layer 22 corresponds to, e.g., variable resistance layer 1c in FIG. 1.

Probe 25 corresponds to, e.g., second electrode 1b in FIG. 1.

Recording material layer 22 has data areas and servo areas arranged at both ends of the data areas in the X direction. The data areas occupy a primary part of recording material layer 22.

A servo burst signal is recorded in the servo areas. The servo burst signal is indicative of the positional information in the Y direction in the data areas.

Besides such information, an address area in which address data is recorded and a preamble area used for achieving synchronization are arranged in recording material layer 22.

The data and the servo burst signal are recorded in recording material layer 22 as a recording bit (a fluctuation in electrical resistance). Information "1" or "0" of the recording bit is read by detecting the electrical resistance of recording material layer 22.

In this example, one probe (a head) is provided in association with one data area, and one probe is provided in association with one servo area.

The data area is constituted of tracks. A track in the data area is specified by an address signal read from the address area. Moreover, a servo burst signal read from the servo area is used for moving probe 25 to the center of the track to eliminate a read error of the recording bit.

Here, associating the X direction with a down-track direction and associating the Y direction with a track direction enables utilizing a head position control technology of an HDD.

Figure 13:
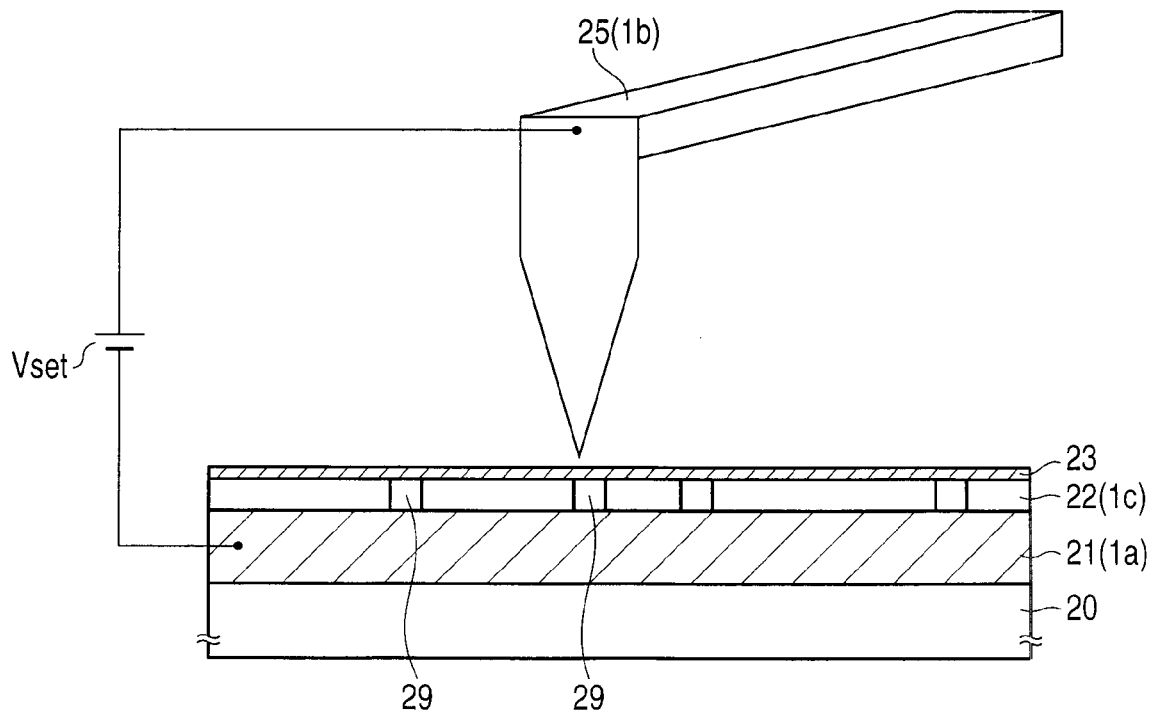

FIG. 13 shows a state at the time of a read/write (set)/erase (reset) operation.

The recording medium is assumed to comprise electrode layer 21 (first electrode 1a) on semiconductor substrate (e.g., a silicon chip) 20, recording material layer 22 (variable resistance layer 1c) on electrode layer 21, and a protection layer 23 on recording material layer 22.

The write operation is carried out by, e.g., applying write voltage Vset to recording bit 29 of recording material layer 22 to generate a potential gradient in recording bit 29. Specifically, a current/voltage pulse can be applied to recording bit 29.

In this example, a state that a potential of probe 25 is relatively higher than a potential of electrode layer 21 is formed. When electrode layer 21 is assumed to have a fixed potential (e.g., a ground potential), a positive potential can be provided to probe 25.

At this time, a length of a filament extending from electrode layer 21 (first electrode 1a) is determined in accordance with an intensity (e.g., V1, V2, V3, or V4 in FIG. 2) of write voltage Vset, and multilevel data associated with this length of the filament is written into recording bit 29.

The erase operation is executed by, e.g., forming a state that a potential of probe 25 is relatively lower than a potential of electrode layer 21. When electrode layer 21 is assumed to have a fixed potential (e.g., a ground potential), a negative potential can be provided to probe 25.

The read operation is carried out by flowing a current pulse to recording bit 29 to detect a resistance value of recording bit 29. However, the current pulse is determined to have a small value with which a recording material constituting recording bit 29 does not cause a change in resistance.

For example, a read current (a current pulse) generated by a sense amplifier S/A is flowed to recording material layer (recording bit) 22 from probe 25, and a resistance value of the recording bit is measured by the sense amplifier S/A.

It is to be noted that the read operation can be continuously performed by scanning probe 25.

4. Manufacturing Method

A manufacturing method of this disclosed information recording device will now be described.

Although an example of the resistance change type non-volatile semiconductor memory described in the above application example will be explained, a process of manufacturing a variable resistance element itself can be independently used, and it can be applied to, e.g., the probe memory described in the above application example.

A. FIRST EXAMPLE

FIG. 14A to 14D show a first example of the manufacturing method of the information recording device.

Figure 14A:
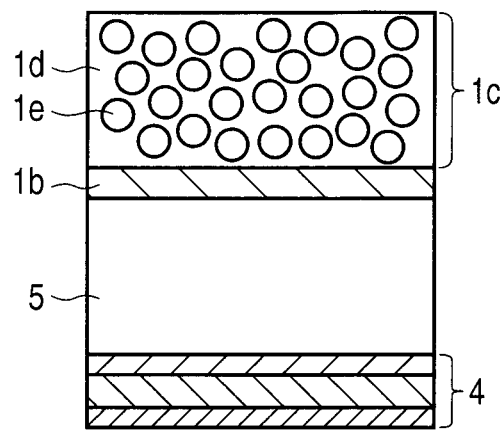

First, as shown in FIG. 14A, a laminated structure including TiN layer 4a, W layer 4b, and TiN layer 4c is formed as lower wiring line (e.g., a bit line) 4. Additionally, diode layer 5 having rectifying characteristics is formed on lower wiring line 4.

Further, a P-type silicon layer containing B is formed as lower electrode (a second electrode) 1b on diode layer 5.

This P-type silicon layer containing B can be formed by using a gas having disilane and diborane mixed therein based on a thermal CVD (Chemical Vapor Deposition) method or a plasma CVD method, for example. Furthermore, the P-type silicon layer containing B can be formed by forming a silicon layer and then implanting B into the silicon layer with an acceleration voltage of 1 keV and a dose amount of $2\times10^{15}$ $cm^{-2}$.

Moreover, variable resistance layer 1c is formed on lower electrode 1b by using, e.g., a sputtering method. Variable resistance layer 1c is high-resistance material 1d containing low-resistive nano-particles 1e.

When low-resistive nano-particles are Mo particles and high-resistance material 1d is silicon, variable resistance layer 1c can be formed by simultaneously depositing silicon and the Mo particles based on, e.g., a co-sputtering method. At this time, when conditions for silicon sputtering and Mo sputtering are controlled, a size and an interval (a particle density) of the low-resistive nano-particles can be controlled.

Figure 14B:
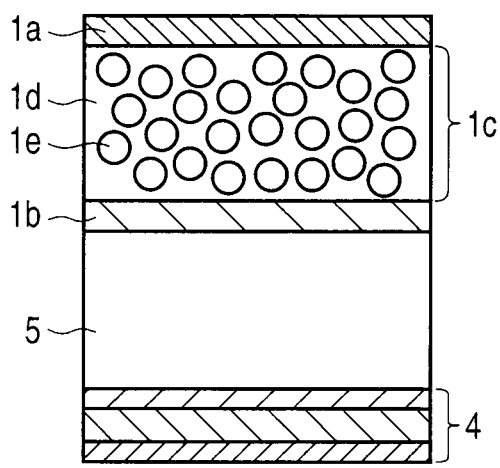

Then, as shown in FIG. 14B, an Ag layer is formed as upper electrode (a first electrode) 1a on variable resistance layer 1c. The Ag layer is formed by, e.g., the sputtering method, and it functions as a growth source of a metal filament that extends from upper electrode 1a toward lower electrode 1b in variable resistance layer 1c.

Subsequently, as shown in FIG. 14C, upper electrode 1a, variable resistance layer 1c, lower electrode 1b, and diode layer 5 are patterned by using a lithography method and a reactive ion etching (RIE) method to form cylindrical variable resistance element 1 and diode layer 5.

At last, as shown in FIG. 14D, insulating layer 6 fills side surfaces of variable resistance element 1 and diode layer 5. Further, an Al layer is formed as upper wiring line (e.g., a word line) 7 on upper electrode 1a. The Al layer is formed by, e.g., the sputtering method.

The above-described steps bring this disclosed information recording device to completion.

It is to be noted that variable resistance layer 1c is obtained by depositing silicon and the metal particles based on the co-sputtering method in this example, but the embodiment is not restricted thereto, and variable resistance layer 1c may be formed by, e.g., alternately sputtering silicon and the metal particles.

B. SECOND EXAMPLE

FIG. 15A to FIG. 15H show a second example of the manufacturing method of the information recording device.

The second example is characterized in a step of aligning low-resistive nano-particles 1e in variable resistance layer 1c as compared with the first example.

First, as shown FIG. 15A, a laminated structure including TiN layer 4a, W layer 4b, and TiN layer 4c is formed as lower wiring line (e.g., a bit line) 4. Diode layer 5 having rectifying characteristics is formed on lower wiring line 4.

Further, a P-type silicon layer containing B is formed as lower electrode (a second electrode) 1b on diode layer 5.

The P-type silicon layer containing B can be formed by, e.g., using a gas having disilane and diborane mixed therein based on a thermal CVD method or a plasma CVD method. Furthermore, the P-type silicon layer containing B can be formed by, e.g., forming a silicon layer and then implanting B into the silicon layer with an acceleration voltage of 1 keV and a dose amount of $2\times10^{15}$ $cm^{-2}$.

Moreover, for example, silicon is formed as high-resistance material 1d on lower electrode 1b by using, e.g., a sputtering method.

Additionally, as shown in FIG. 15B, ferritin 8 containing low-resistive nano-particles (e.g., Mo particles) 1e is applied onto high-resistance material 1d in a self-aligning manner. Subsequently, a heat treatment is carried out to remove an organic compound in ferritin 8. Consequently, as shown in FIG. 15C, aligned low-resistive nano-particles 1e remain on high-resistance material 1d.

Then, as shown in FIG. 15D, for example, the sputtering method is used to form high-resistance material (e.g., silicon) 1d that covers low-resistive nano-particles 1e.

Additionally, ferritin 8 containing low-resistive nano-particles (e.g., Mo particles) 1e is again applied onto high-resistance material 1d in the self-aligning manner. Subsequently, when a heat treatment is carried out to remove an organic compound in ferritin 8, aligned low-resistive nano-particles 1e remain on high-resistance material 1d.

Further, steps from the formation of high-resistance material 1d to the formation of low-resistive nano-particles 1e (FIG. 15A to FIG. 15D) are repeatedly carried out to form variable resistance layer 1c on lower electrode 1b as shown in FIG. 15E. Variable resistance layer 1c is high-resistance material 1d containing low-resistive nano-particles 1e.

Figure 15F:
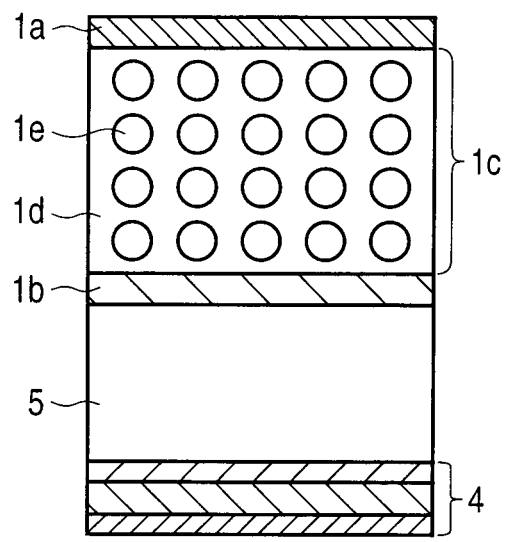

Then, as shown in FIG. 15F, an Ag layer is formed as upper electrode (a first electrode) 1a on variable resistance layer 1c. The Ag layer is formed by, e.g., the sputtering method, and it functions as a growth source of a metal filament that extends from upper electrode 1a to lower electrode 1b in variable resistance layer 1c.

Figure 15G:
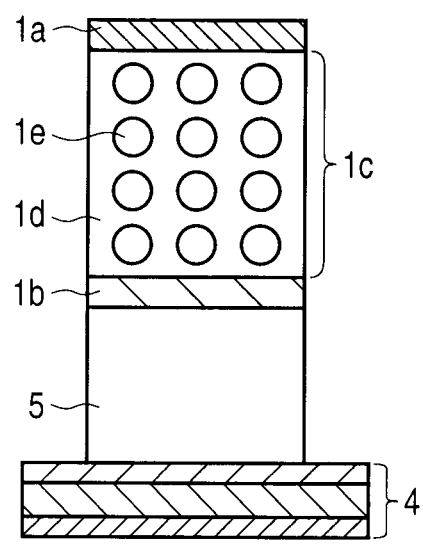

Subsequently, as shown in FIG. 15G, upper electrode 1a, variable resistance layer 1c, lower electrode 1b, and diode layer 5 are patterned by using a lithography method and a reactive ion etching method, thereby forming, e.g., cylindrical variable resistance element 1 and diode layer 5.

Figure 15H:
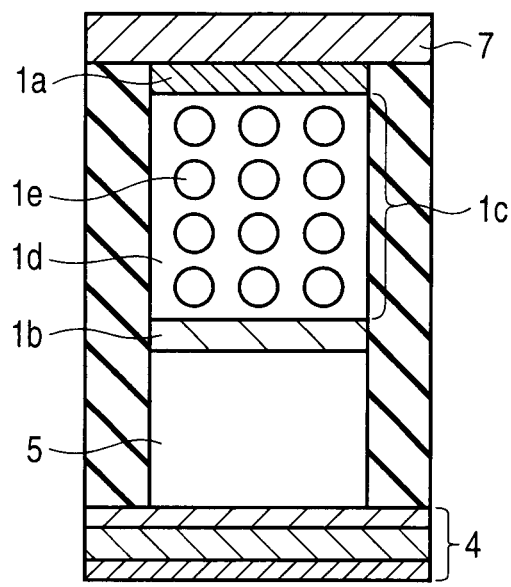

At last, as shown in FIG. 15H, insulating layer 6 fills side surfaces of variable resistance element 1 and diode layer 5. Furthermore, an Al layer is formed as upper wiring line (e.g., a word line) 7 on upper electrode 1a. The Al layer is formed by, e.g., the sputtering method.

The above-described steps bring this disclosed information recording device to completion.

It is to be noted that ferritin 8 containing metallic particles is utilized to form variable resistance layer 1c in this example. At this time, since ferritin 8 is aligned in the self-aligning manner, an interval between low-resistive nano-particles in a radial direction can be maintained constant.

Additionally, changing a size of an organic compound in ferritin 8 enables aligning low-resistive nano-particles 1e having a desired density with excellent controllability.

C. THIRD EXAMPLE

FIG. 16A to FIG. 16D show a third example of the manufacturing method of the information recording device.

The third example is a modification of the second example.

This modification is characterized in that a ferritin size is changed as low-resistive nano-particle layer is distanced from lower electrode (as it gets closer to first layer, second layer, and third layer in a mentioned order) in a process of repeating deposition of high-resistance material and formation of low-resistive nano-particles, thereby changing a density of low-resistive nano-particles in a radial direction. As a result, a fluctuation of a resistance value among elements can be reduced.

Figure 16A:
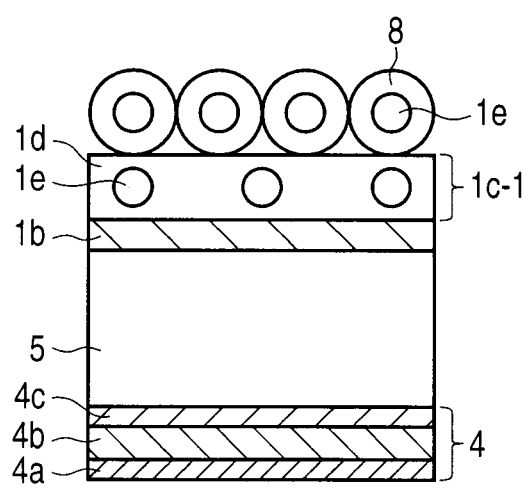
Figure 16B:
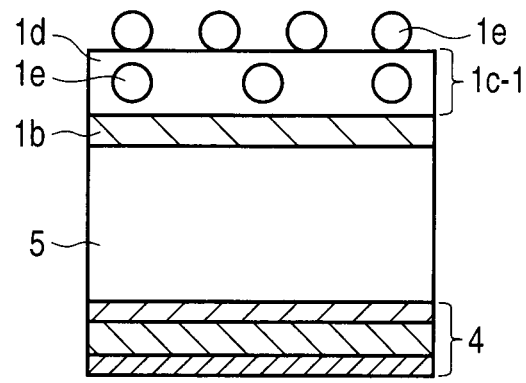

First, as shown in FIG. 16A, lower wiring line 4, diode layer 5, and lower electrode 1b are formed by using the same process as that depicted in FIG. 15A to 15C. Furthermore, high-resistance material (e.g., silicon) 1d is formed on lower electrode 1b, and low-resistive nano-particles (e.g., Mo particles) 1e of a first layer are formed on high-resistance material 1d.

Low-resistive nano-particles 1e of the first Layer can be aligned in the self-aligning manner by utilizing ferritin containing low-resistive nano-particles 1e. A density of low-resistive nano-particles 1e of the first layer in the radial direction is determined as D1. Subsequently, a heat treatment is performed to remove an organic compound of ferritin.

Thereafter, high-resistance material (e.g., silicon) 1d that covers low-resistive nano-particles 1e of the first layer is formed by using, e.g., the sputtering method to form variable resistance layer 1c-1 of the first layer.

Further, ferritin 8 containing low-resistive nano-particles (e.g., Mo particles) 1e is again applied onto high-resistance material 1d in the self-aligning manner. A size of this ferritin 8 is smaller than a size of ferritin that is used when forming low-resistive nano-particles 1e of the first layer.

Subsequently, when a heat treatment is performed to remove an organic compound of ferritin 8, aligned low-resistive nano-particles 1e of a second layer are formed on variable resistance layer 1c-1 of the first layer. A density D2 of low-resistive nano-particles 1e of the second layer in the radial direction is higher than the density D1 of low-resistive nano-particles 1e of the first layer in the radial direction (D2>D1).

Figure 16C:
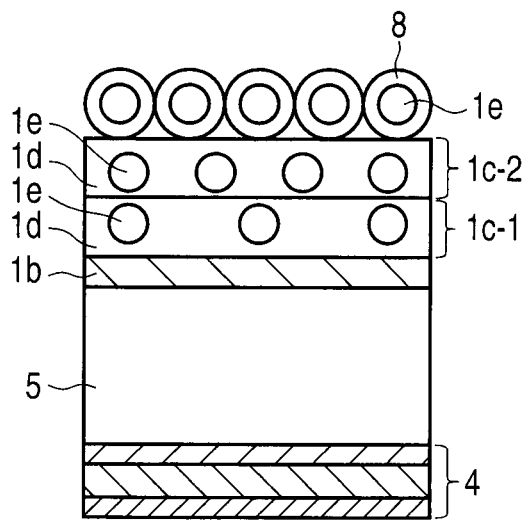

Likewise, as shown in FIG. 16C, high-resistance material (e.g., silicon) 1d that covers low-resistive nano-particles 1e of the second layer is formed by using, e.g., the sputtering method to form variable resistance layer 1c-2 of the second layer.

Further, ferritin 8 containing low-resistive nano-particles (e.g., Mo particles) 1e is again applied onto high-resistance material 1d of the second layer in the self-aligning manner. A size of this ferritin 8 is smaller than a size of ferritin that is used when forming low-resistive nano-particles 1e of the second layer.

Subsequently, when a heat treatment is performed to remove an organic compound of ferritin 8, aligned low-resistive nano-particles 1e of a third layer are formed on variable resistance layer 1c-2 of the second layer. A density D3 of low-resistive nano-particles 1e of the third layer in the radial direction is higher than the density D2 of low-resistive nano-particles 1e of the second layer in the radial direction (D3>D2).

Furthermore, the variable resistance layer is formed on lower electrode 1b by repeatedly executing the above-described steps. In the variable resistance layer, the density of the low-resistive nano-particles in the radial direction increases as getting apart from the lower electrode (as approaching toward the first layer, the second layer, and the third layer in the mentioned order).

Then, an Ag layer is formed as an upper electrode (a first electrode) on the variable resistance layer by using the same process as that shown in FIG. 15F to FIG. 15H. Moreover, the lithography method and the reactive ion etching method are utilized to perform patterning, thereby forming the cylindrical variable resistance element and diode layer. At last, side surfaces of the variable resistance element and the diode layer are filled with an insulating layer, and an Al layer is formed as upper wiring lines (e.g., word lines) on the upper electrode.

The above-described steps bring this disclosed information recording device to completion.

D. FOURTH EXAMPLE

FIG. 17A to FIG. 17F show a fourth example of the manufacturing method of the information recording device.

The fourth example is a modification of the second example.

This modification is characterized in a process of changing a density of low-resistive nano-particles in a radial direction to reduce a fluctuation of a resistance value among elements like the third example.

However, the fourth example is different from the third example in that a variable resistance layer is formed by co-sputtering which is performed more than once and the density of the low-resistive nano-particles in the radial direction is changed as getting away from a lower electrode (as approaching toward the first layer, the second layer, and the third layer in the mentioned order) by changing a density of the low-resistive nano-particles at each co-sputtering.

First, as shown in FIG. 17A, lower wiring line 4, diode layer 5, and lower electrode 1b are formed by using the same process as that depicted in FIG. 15A.

Then, variable resistance layer 1c-1 of a first layer in which low-resistive nano-particles (e.g., Mo particles) 1e have a density D1 is formed on lower electrode 1b by the co-sputtering method.

For example, after high-resistance material 1*d* containing low-resistive nano-particles 1*e* having a particle diameter $\phi_S$ and a density D1 is deposited by the co-sputtering method, low-resistive nano-particles 1*e* having the particle diameter $\phi_S$ are agglomerated as shown in FIG. 17B by performing annealing at, e.g., approximately 500° C., thereby forming variable resistance layer 1*c*-1 of the first layer having low-resistive nano-particles 1*e* with a particle diameter $\phi_L$ and the density D1.

Then, as shown in FIG. 17C, variable resistance layer 1*c*-2 of a second layer in which low-resistive nano-particles (e.g., Mo particles) 1*e* have a density D2 is again formed on variable resistance layer 1*c*-1 of the first layer by the co-sputtering method. The density D2 of low-resistive nano-particles 1*e* of the second layer is higher than the density D1 of low-resistive nano-particles 1*e* of the first layer (D2>D1).

For example, after high-resistance material 1*d* containing low-resistive nano-particles 1*e* having the particle diameter $\phi_S$ and the density D2 is deposited by the co-sputtering method, low-resistive nano-particles 1*e* having the particle diameter $\phi_S$ are agglomerated as shown in FIG. 17D by performing annealing at, e.g., approximately 500° C., thereby forming variable resistance layer 1*c*-2 of the second layer having low-resistive nano-particles 1*e* with the particle diameter $\phi_L$ and the density D2.

The density D2 of low-resistive nano-particles 1*e* in a radial direction in variable resistance layer 1*c*-2 of the second layer is higher than the density D1 of low-resistive nano-particles 1*e* in the radial direction in variable resistance layer 1*c*-1 of the first layer.

Figure 17E:
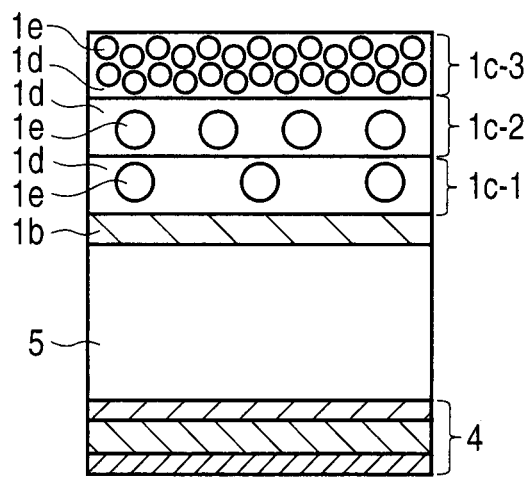

Then, as shown in FIG. 17E, variable resistance layer 1*c*-3 of a third layer in which low-resistive nano-particles (e.g., Mo particles) 1*e* have a density D3 is again formed on variable resistance layer 1*c*-2 of the second layer by the co-sputtering method. The density D3 of low-resistive nano-particles 1*e* of the third layer is higher than the density D2 of low-resistive nano-particles 1*e* of the second layer (D3>D2).

Figure 17F:
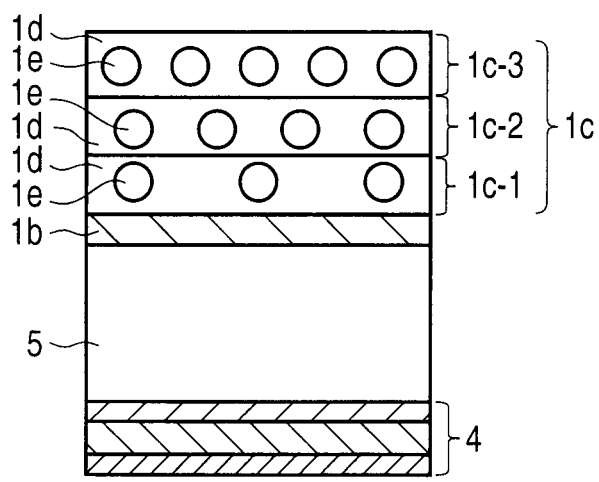

For example, after high-resistance material 1*d* containing low-resistive nano-particles 1*e* having the particle diameter $\phi_S$ and the density D3 is deposited by the co-sputtering method, low-resistive nano-particles 1*e* having the particle diameter $\phi_S$ are agglomerated as shown in FIG. 17F by performing annealing at, e.g., approximately 500° C., thereby forming variable resistance layer 1*c*-3 of the third layer having low-resistive nano-particles 1*e* with the particle diameter $\phi_L$ and the density D3.

The density D3 of low-resistive nano-particles 1*e* in the radial direction in variable resistance layer 1*c*-3 of the third layer is higher than the density D2 of low-resistive nano-particles 1*e* in the radial direction in variable resistance layer 1*c*-2 of the second layer.

Moreover, the variable resistance layer is formed on lower electrode 1*b* by repeatedly executing the above-described steps. In the variable resistance layer, the density of the low-resistive nano-particles in the radial direction increases as distanced from the lower electrode (as approaching toward the first layer, the second layer, and the third layer in the mentioned order).

Then, an Ag layer is formed as an upper electrode (a first electrode) on the variable resistance layer by using the same process as that shown in FIG. 15H to FIG. 15J. Moreover, the lithography method and the reactive ion etching method are utilized to perform patterning, thereby forming cylindrical variable resistance element and diode layer. At last, side surfaces of the variable resistance element and the diode layer are filled with an insulating layer, and an Al layer is formed as upper wiring lines (e.g., word lines) on the upper electrode.

The above-described steps bring this disclosed information recording device to completion.

Here, although annealing is performed in each layer of the variable resistance layer after sputtering and the low-resistive nano-particles are formed by agglomeration in this embodiment, a variable resistance layer having the same density distribution can be formed even if the respective layers are collectively annealed after co-sputtering to perform agglomeration.

Figure 18A:
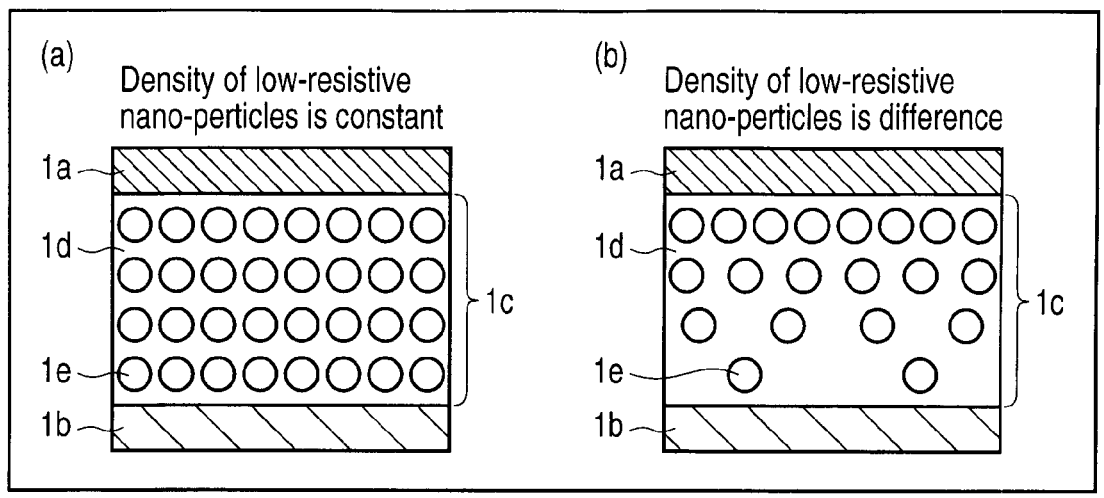
FIGS. 18A and 18B show an effect of a disclosure.
Figure 18B:
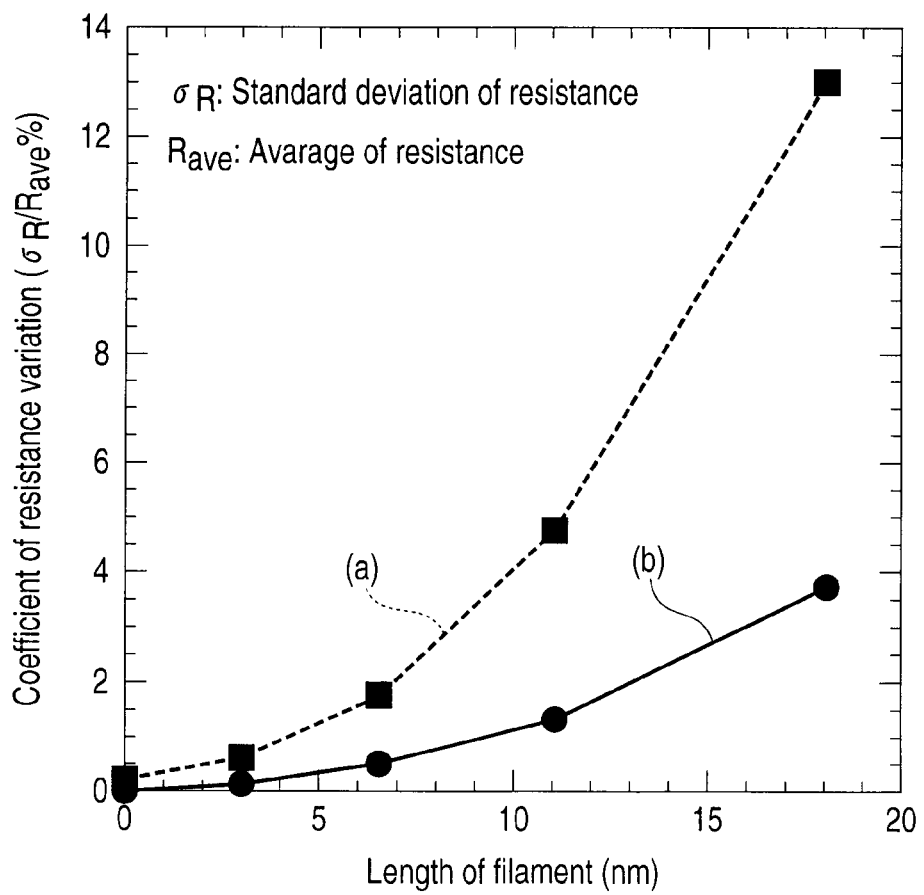

According to the processes in the third example and the fourth example, when the density of low-resistive nano-particles 1*e* is changed in the film thickness direction of variable resistance layer 1*c*, a variation in a resistance value of variable resistance layer 1*c* with respect to a filament length can be reduced as shown in FIG. 18A and FIG. 18B, for example.

Therefore, adopting the processes according to the third example and the fourth example enables realizing the information recording device that has a reduced fluctuation of a resistance value among elements and has excellent characteristics.

It is to be noted that FIG. 18A and FIG. 18B show each coefficient of variation obtained by dividing a standard deviation value of a resistance value by an average value when the four low-resistive nano-particle layers are provided and a filament comes into contact with each low-resistive nano-particle layer.

E. FIFTH EXAMPLE

FIG. 19A to FIG. 19G show a fifth example of the manufacturing method of the information recording device.

The fifth example is a modification of the second example.

This modification is characterized in that a thicknesses of variable resistance layers are changed in the process according to the second example. Additionally, the variable resistance layers are formed by utilizing ferritin in the third example. As a result, a fluctuation of a resistance value among elements can be reduced.

Although a situation where a density of low-resistive nano-particles 1*e* is fixed in a film thickness direction of variable resistance layer 1*c* will be described hereinafter based on the second example, this example can be combined with the third example where the density of low-resistive nano-particles 1*e* changes in the film thickness direction of variable resistance layer 1*c*. This example can reduce a fluctuation of a resistance value among elements.

First, as shown in FIG. 19A, lower wiring line 4, diode layer 5, and lower electrode 1*b* are formed by using the same process as that depicted in FIG. 15A to 15C.

Thereafter, high-resistance material (e.g., silicon) 1*d* is formed on lower electrode 1*b*, and ferritin 8 containing low-resistive nano-particles (e.g., Mo particles) 1*e* is applied onto high-resistance material 1*d* in a self-aligning manner. Subsequently, when a heat treatment is performed to remove an organic compound of ferritin 8, aligned low-resistive nano-particles 1*e* of a first layer are formed as shown in FIG. 19B.

Then, high-resistance material (e.g., silicon) 1*d* that covers low-resistive nano-particles 1*e* of the first layer is formed by using, e.g., a sputtering method to form variable resistance layer 1*c*-1 of the first layer. A thickness of variable resistance layer 1*c*-1 of the first layer (a thickness in the film thickness direction) is t1 (e.g., 5.0 nm).

Further, ferritin 8 containing low-resistive nano-particles (e.g., Mo particles) 1*e* is again applied onto variable resistance layer 1*c*-1 of the first layer in the self-aligning manner. Subsequently, when a heat treatment is performed to remove an organic compound of ferritin 8, aligned low-resistive nano-particles 1e of a second layer are formed on variable resistance layer 1c-1 of the first layer as shown in FIG. 19D.

Thereafter, high-resistance material (e.g., silicon) 1d that covers low-resistive nano-particles 1e of a second layer is formed by using, e.g., a sputtering method to form variable resistance layer 1c-2 of the second layer. A thickness of variable resistance layer 1c-2 of the second layer (a thickness in the film thickness direction) is t2 (e.g., 2.5 nm) smaller than t1.

Further, ferritin 8 containing low-resistive nano-particles (e.g., Mo particles) 1e is again applied onto variable resistance layer 1c-2 of the second layer in the self-aligning manner. Subsequently, when a heat treatment is performed to remove an organic compound of ferritin 8, aligned low-resistive nano-particles in of a third layer are formed on variable resistance layer 1c-2 of the second layer as shown in FIG. 19F.

Thereafter, high-resistance material (e.g., silicon) 1d that covers low-resistive nano-particles 1e of the third layer is formed by using, e.g., a sputtering method to form variable resistance layer 1c-3 of the third layer. A thickness of variable resistance layer 1c-3 of the third layer (a thickness in the film thickness direction) is t3 (e.g., 1.5 nm) smaller than t2.

Further, as shown in FIG. 19G, ferritin containing low-resistive nano-particles (e.g., Mo particles) 1e is again applied onto variable resistance layer 1c-3 of the third layer in the self-aligning manner. Subsequently, when a heat treatment is performed to remove an organic compound of ferritin, aligned low-resistive nano-particles 1e of a fourth layer are formed on variable resistance layer 1c-3 of the third layer.

Thereafter, high-resistance material (e.g., silicon) 1d that covers low-resistive nano-particles 1e of the fourth layer is formed by using, e.g., a sputtering method to form variable resistance layer 1c-4 of the fourth layer. A thickness of variable resistance layer 1c-4 of the fourth layer (a thickness in the film thickness direction) is t4 (e.g., 1.5 nm). t4 may be equal to t3 or may be smaller than t3.

Additionally, an Ag layer is formed as upper electrode (a first electrode) 1a on the variable resistance layer by using the same process as that depicted in FIG. 15F to FIG. 15H. Further, the lithography method and the reactive ion etching method are utilized to perform patterning to form, e.g., cylindrical variable resistance element and diode layer. At last, side surfaces of the variable resistive layer and the diode layer are filled with an insulating layer, and an Al layer is formed as upper wiring lines (e.g., word lines) on the upper electrode.

The above-described steps bring this disclosed information recording device to completion.

F. SIXTH EXAMPLE

FIG. 20A to 20I show a sixth example of the manufacturing method of the information recording device.

The sixth example is a modification of the second example.

This modification is characterized in that a thicknesses of variable resistance layers are changed in the process according to the second example. Additionally, the variable resistance layers are formed by utilizing the co-sputtering method in the fourth example. As a result, a fluctuation of a resistance value among elements can be reduced.

Although a situation where a density of low-resistive nano-particles 1e is fixed in a film thickness direction of variable resistance layer 1c will be described hereinafter based on the second example, this example can be combined with the fourth example where the density of low-resistive nano-particles 1e changes in the film thickness direction of variable resistance layer 1c. This example can further reduce a fluctuation of a resistance value among elements.

Figure 20A:
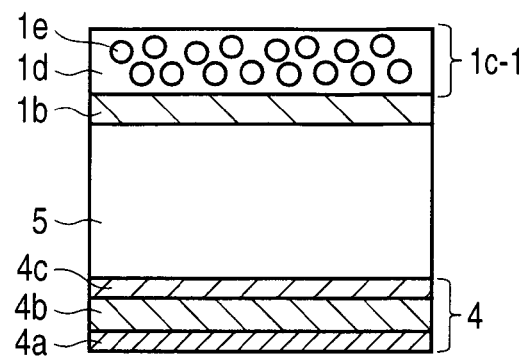

First, as shown in FIG. 20A, lower wiring line 4, diode layer 5, and lower electrode 1b are formed by using the same process as that depicted in FIG. 15A.

Then, variable resistance layer 1c-1 of a first layer in which low-resistive nano-particles (e.g., Mo particles) 1e have a density D1 is formed on lower electrode 1b by the co-sputtering method.

Figure 20B:
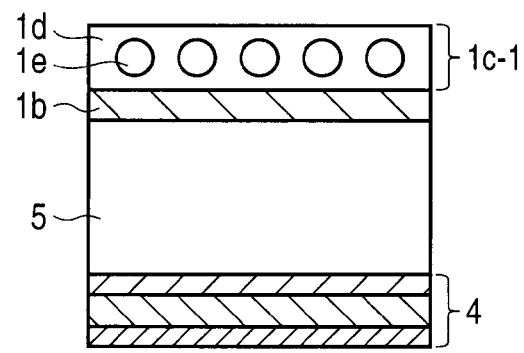

For example, after high-resistance material 1d containing low-resistive nano-particles 1e having a particle diameter $\phi_S$ and the density D1 is deposited by the co-sputtering method, low-resistive nano-particles 1e having the particle diameter $\phi_S$ are agglomerated as shown in FIG. 20B by performing annealing at, e.g., approximately 500° C., thereby forming variable resistance layer 1c-1 of the first layer having low-resistive nano-particles 1e with a particle diameter $\phi_L$ and the density D1.

Figure 20C:
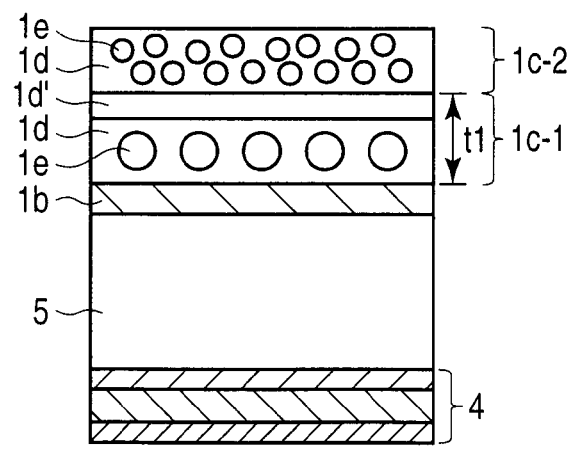

Then, as shown in FIG. 20C, high-resistance material 1d' is laminated on variable resistance layer 1c-1 of the first layer. As a result, a thickness of variable resistance layer 1c-1 of the first layer is t1 (e.g., 5 nm).

Then, variable resistance layer 1c-2 of a second layer in which low-resistive nano-particles (e.g., Mo particles) 1e have the density D1 is again formed on variable resistance layer 1c-1 of the first layer by the co-sputtering method.

For example, after high-resistance material 1d containing low-resistive nano-particles 1e having the particle diameter $\phi_S$ and the density D1 is deposited by the co-sputtering method, low-resistive nano-particles 1e having the particle diameter $\phi_S$ are agglomerated as shown in FIG. 20D by performing annealing at, e.g., approximately 500° C., thereby forming variable resistance layer 1c-2 of the second layer having low-resistive nano-particles 1e with the particle diameter $\phi_L$ and the density D1.

Subsequently, as shown in FIG. 20E, high-resistance material 1d' is laminated on variable resistance layer 1c-2 of the second layer. However, this lamination amount is smaller than a lamination amount of high-resistance material 1d' when forming variable resistance layer 1c-1 of the first layer. As a result, a thickness of variable resistance layer 1c-2 of the second layer is t2 (e.g., 2.5 nm) smaller than t1.

Then, as shown in FIG. 20F, variable resistance layer 1c-3 of a third layer in which low-resistive nano-particles (e.g., Mo particles) 1e have the density D1 is again formed on variable resistance layer 1c-2 of the second layer by the co-sputtering method.

For example, after high-resistance material 1d containing low-resistive nano-particles 1e having the particle diameter $\phi_S$ and the density D1 is deposited by the co-sputtering method, low-resistive nano-particles 1e having the particle diameter $\phi_S$ are agglomerated as shown in FIG. 20G by performing annealing at, e.g., approximately 500° C., thereby forming variable resistance layer 1c-3 of the third layer having low-resistive nano-particles 1e with the particle diameter $\phi_L$ and the density D1.

Here, for example, high-resistance material is not laminated on variable resistance layer 1c-3 of the third layer. As a result, a thickness of variable resistance layer 1c-3 of the third layer is t3 (e.g., 1.5 nm) smaller than t2.

Figure 20H:
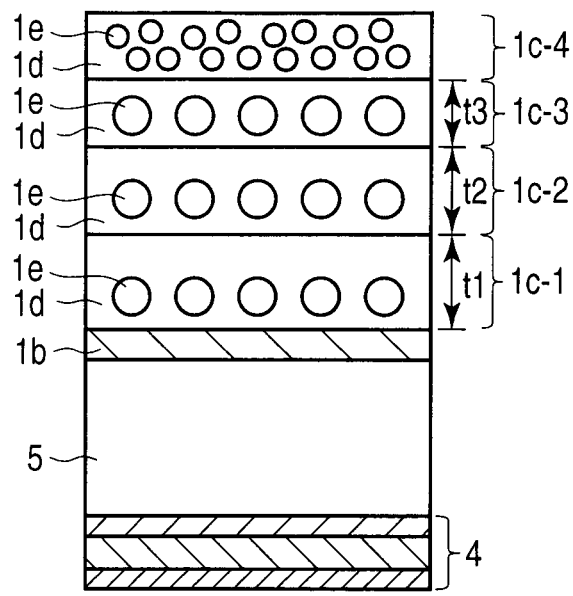

Then, as shown in FIG. 20H, variable resistance layer 1c-4 of a fourth layer in which low-resistive nano-particles (e.g., Mo particles) 1e have the density D1 is again formed on variable resistance layer 1c-3 of the third layer by the co-sputtering method.

Figure 20I:
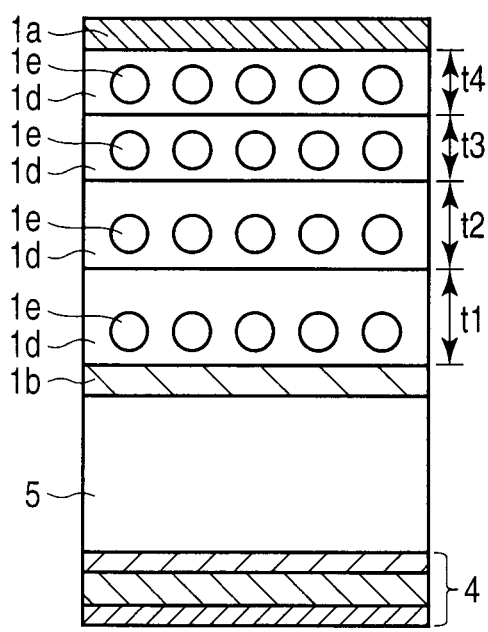

For example, after high-resistance material 1d containing low-resistive nano-particles 1e having the particle diameter $\phi_S$ and the density D1 is deposited by the co-sputtering method, low-resistive nano-particles 1e having the particle diameter $\phi_S$ are agglomerated as shown in FIG. 20I by performing annealing at, e.g., approximately 500° C., thereby forming variable resistance layer 1c-4 of the fourth layer having low-resistive nano-particles 1e with the particle diameter $\phi_L$ and the density D1.

Here, for example, high-resistance material is not laminated on variable resistance layer 1c-4 of the fourth layer. As a result, a thickness of variable resistance layer 1c-4 of the fourth layer is t4 (e.g., 1.5 nm) equal to t3.

Then, an Ag layer is formed as an upper electrode (a first electrode) on the variable resistance layer by using the same process as that shown in FIG. 15F to FIG. 15H. Moreover, the lithography method and the reactive ion etching method are utilized to perform patterning, thereby forming cylindrical variable resistance element and diode layer. At last, side surfaces of the variable resistance element and the diode layer are filled with an insulating layer, and an Al layer is formed as upper wiring lines (e.g., word lines) on the upper electrode.

The above-described steps bring this disclosed information recording device to completion.

Figure 21:
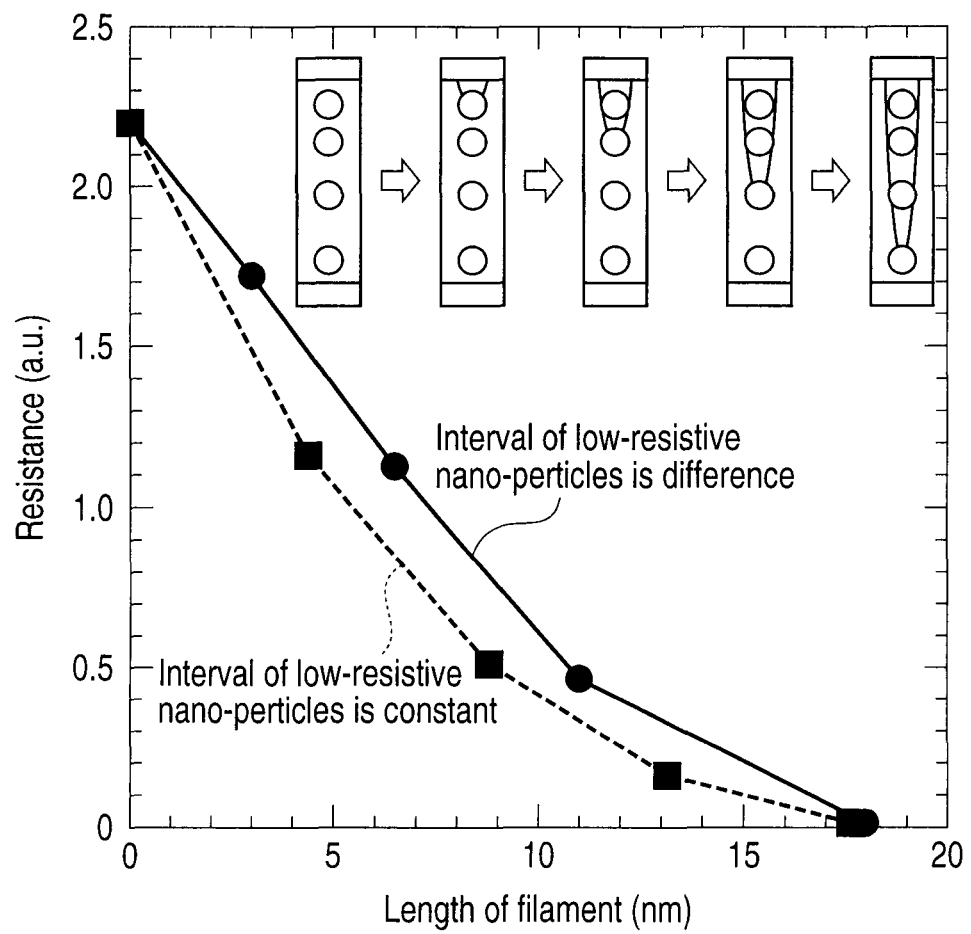
FIG. 21 shows an effect of a disclosure.

According to the processes of the fifth example and the sixth example, when each interval between low-resistive nano-particles 1e differs in the film thickness direction of variable resistance layer 1c, a rate of resistance change of variable resistance layer 1c with respect to a filament length can be fixed as shown in, e.g., FIG. 21, thereby assuring a large margin between respective threshold distributions of multilevel data.

FIG. 21 shows values obtained by simulation when a particle diameter of the low-resistive nano-particles is 2 nm, a thickness of variable resistance layer 1c-1 of the first layer is 5.0 nm, a thickness of variable resistance layer 1c-2 of the second layer is 2.5 nm, and a thickness of each of variable resistance layers 1c-3 and 1c-4 of the third and fourth layers is 1.5 nm in the configurations depicted in FIGS. 19G and 20I.

As apparent from this drawing, aligning the low-resistive nano-particles at equal intervals in the film thickness direction can reduce a difference in resistance value between a situation where the filament extends to the low-resistive nano-particle of the second layer and a situation where the same extends to the low-resistive nano-particle of the first layer in particular.

On the other hand, aligning the low-resistive nano-particles at different intervals in the film thickness direction can substantially eliminate a difference in resistance value between a situation where the filament extends to the low-resistive nano-particle of the fourth layer, a situation where the same extends to the low-resistive nano-particle of the third layer, a situation where the same extends to the low-resistive nano-particle of the second layer, and a situation where the same extends to the low-resistive nano-particle of the first layer.

Therefore, a large margin between resistance values (threshold distributions) of multilevel data can be assured, thereby realizing the information recording device having excellent characteristics.

When the fifth example and the sixth example are combined with the third example and the fourth example, a fluctuation of a resistance value among elements can be reduced, and a large margin between resistance values of multilevel data can be assured, thus highly reliably and accurately controlling realization of multi levels.

G. OTHERS

In the first to sixth examples of the manufacturing method of the information recording device, the variable resistance layer may be formed by repeating of a first step in which a layer including elements (e.g., Mo) is formed by a co-sputtering method and a second step in which the elements are agglomerated to form the particles by a heat treatment (e.g., an annealing).

5. Conclusion

According to this disclosure, the information recording device that can highly accurately control realization of multi levels (changes in resistance) can be realized. This disclosure has considerable industrial merits in regard to a high-speed random write enabled file memory, a high-speed download enabled mobile terminal, a high-speed download enabled portable player, a broadcast equipment semiconductor memory, a drive recorder, a home video, a communication high-capacity buffer memory, a security camera semiconductor memory, and others.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information recording device comprising:
first and second electrodes;
a variable resistance layer between the first and second electrodes; and
a control circuit which controls the variable resistance layer to n (n is a natural number except 1) kinds of resistance,
wherein the variable resistance layer comprises a material filled between the first and second electrodes, and particles arranged in a first direction from the first electrode to the second electrode in the material, and each of the particles has a resistance lower than that of the material,
wherein a resistance of the variable resistance layer is decided by a short between the first electrode and at least one of the particles via a filament made of Ag and extending from the first electrode into the variable resistance layer under control of the control circuit, the first electrode includes Ag, and the particles includes one of Co, Pb, Ge, Mo and W.

2. The device of claim 1,
wherein the resistance of the variable resistance layer is decided by a length of the filament which is provided between the first and second electrodes.

3. The device of claim 1,
wherein a density of the particles becomes smaller from the first electrode to the second electrode.

4. The device of claim 1,
wherein an interval in the first direction of the particles becomes wider from the first electrode to the second electrode.

5. The device of claim 1,
wherein the particles are one of metal particles and silicide particles, and a size of each of the particles ranges from 0.5 nm to 100 nm.

6. The device of claim 1,
wherein the material is one of an amorphous silicon, polycrystalline silicon, and a metal sulfide.

7. The device of claim 1, wherein the information recording device includes multiple level cell.

8. An information recording device comprising:
first and second electrodes;
a variable resistance layer between the first and second electrodes; and
a control circuit which controls the variable resistance layer to n (n is a natural number except 1) kinds of resistance,
wherein the variable resistance layer comprises a material filled between the first and second electrodes, and particles arranged in a first direction from the first electrode to the second electrode in the material, and each of the particles has a resistance lower than that of the material,
wherein a resistance of the variable resistance layer is decided by a short between the first electrode and at least one of the particles via a filament made of Cu and extending from the first electrode into the variable resistance layer under control of the control circuit, the first electrode includes Cu, and the particles include one of Co and Nb.

9. The device of claim 8,
wherein the resistance of the variable resistance layer is decided by a length of the filament which is provided between the first and second electrodes.

10. The device of claim 8,
wherein a density of the particles becomes smaller from the first electrode to the second electrode.

11. The device of claim 8,
wherein an interval in the first direction of the particles becomes wider from the first electrode to the second electrode.

12. The device of claim 8,
wherein the particles are one of metal particles and silicide particles, and a size of each of the particles ranges from 0.5 nm to 100 nm.

13. The device of claim 8,
wherein the material is one of an amorphous silicon, polycrystalline silicon, and a metal sulfide.

14. The device of claim 8,
wherein the information recording device includes multiple level cell.

* * * * *